（12） United States Patent
Su et al.

(10) Patent No.: US 11,621,197 B2
(45) Date of Patent: Apr. 4, 2023

(54) SEMICONDUCTOR DEVICE WITH GATE CUT FEATURE AND METHOD FOR FORMING THE SAME

(71) Applicant: Taiwan Semiconductor Manufacturing Company, Ltd., Hsin-Chu (TW)

(72) Inventors: Huan-Chieh Su, Changhua County (TW); Li-Zhen Yu, Hsinchu (TW); Chun-Yuan Chen, Hsinchu (TW); Lo-Heng Chang, Hsinchu (TW); Cheng-Chi Chuang, New Taipei (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/464,050

(22) Filed: Sep. 1, 2021

(65) Prior Publication Data
US 2022/0262915 A1 Aug. 18, 2022

Related U.S. Application Data

(60) Provisional application No. 63/149,576, filed on Feb. 15, 2021.

(51) Int. Cl.
*H01L 21/8234* (2006.01)
*H01L 29/423* (2006.01)
(Continued)

(52) U.S. Cl.
CPC ............... *H01L 21/823481* (2013.01); *H01L 21/823412* (2013.01); *H01L 21/823418* (2013.01);
(Continued)

(58) Field of Classification Search
CPC ..... H01L 21/823412; H01L 21/823418; H01L 21/823431; H01L 21/823437;
(Continued)

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

| TW | 201904864 A | 2/2019 |
| TW | 202004988 A | 1/2020 |
| TW | 202013525 A | 4/2020 |

*Primary Examiner* — Cheung Lee
(74) *Attorney, Agent, or Firm* — Haynes and Boone, LLP

(57) ABSTRACT

Semiconductor devices and methods of forming the same are provided. A method according to the present disclosure includes providing a workpiece that has a substrate, a first plurality of channel members, a second plurality of channel members, a first gate structure engaging the first plurality of channel members, a second gate structure engaging the second plurality of channel members, a hybrid fin disposed between the first and second gate structures, and an isolation feature disposed under the hybrid fin. The method also includes forming a metal cap layer at a frontside of the workpiece. The metal cap layer electrically connects the first and second gate structures. The method also includes etching the isolation feature, etching the hybrid fin, etching the metal cap layer, and depositing a dielectric material to form a gate isolation feature disposed between the first and second gate structures.

20 Claims, 26 Drawing Sheets

(51) Int. Cl.
*H01L 29/66* (2006.01)
*H01L 29/786* (2006.01)
*H01L 29/06* (2006.01)
*H01L 29/78* (2006.01)
*H01L 27/088* (2006.01)

(52) U.S. Cl.
CPC ........ *H01L 21/823431* (2013.01); *H01L 21/823468* (2013.01); *H01L 27/0886* (2013.01); *H01L 29/0649* (2013.01); *H01L 29/42392* (2013.01); *H01L 29/66742* (2013.01); *H01L 29/7855* (2013.01); *H01L 29/78618* (2013.01); *H01L 29/78696* (2013.01); *H01L 21/823437* (2013.01)

(58) Field of Classification Search
CPC ..... H01L 21/823468; H01L 21/823481; H01L 21/823821; H01L 21/823878; H01L 27/0886; H01L 29/0642; H01L 29/0649; H01L 29/42392; H01L 29/66742; H01L 29/66795; H01L 29/785; H01L 29/7855; H01L 29/78696; B82Y 10/00; B82Y 40/00

See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2019/0164838 | A1* | 5/2019 | Chang ............... H01L 27/0886 |

\* cited by examiner

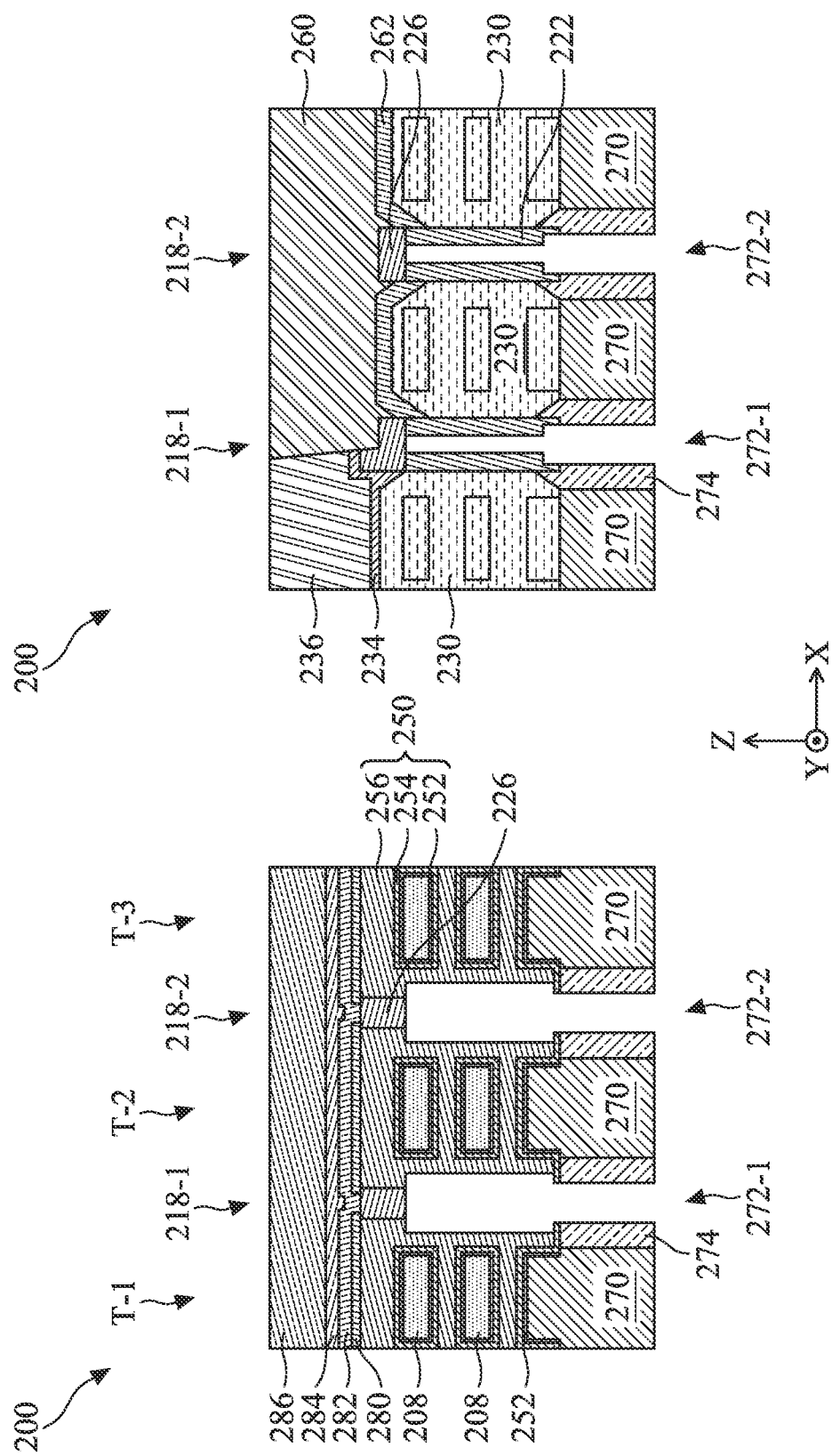

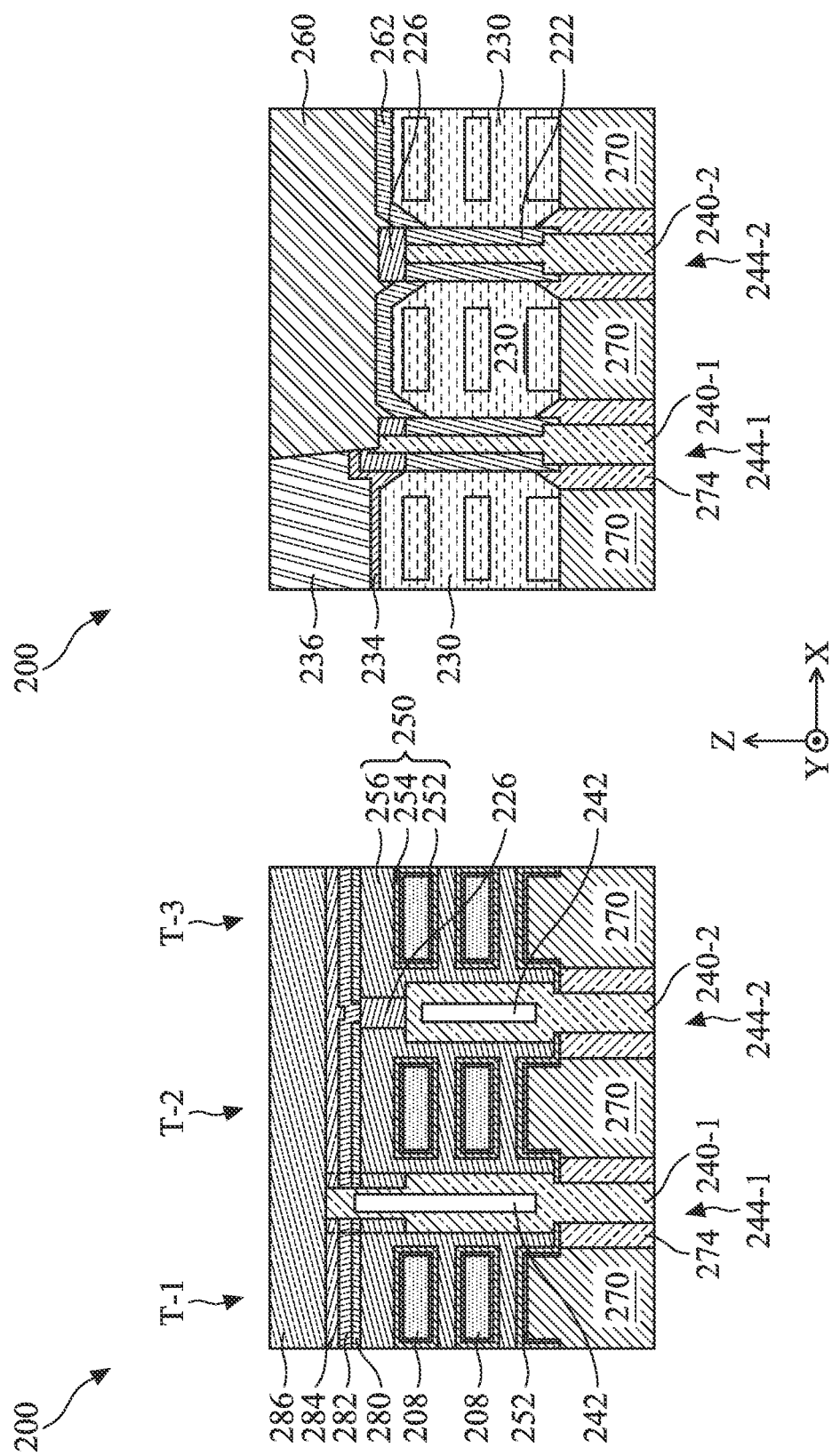

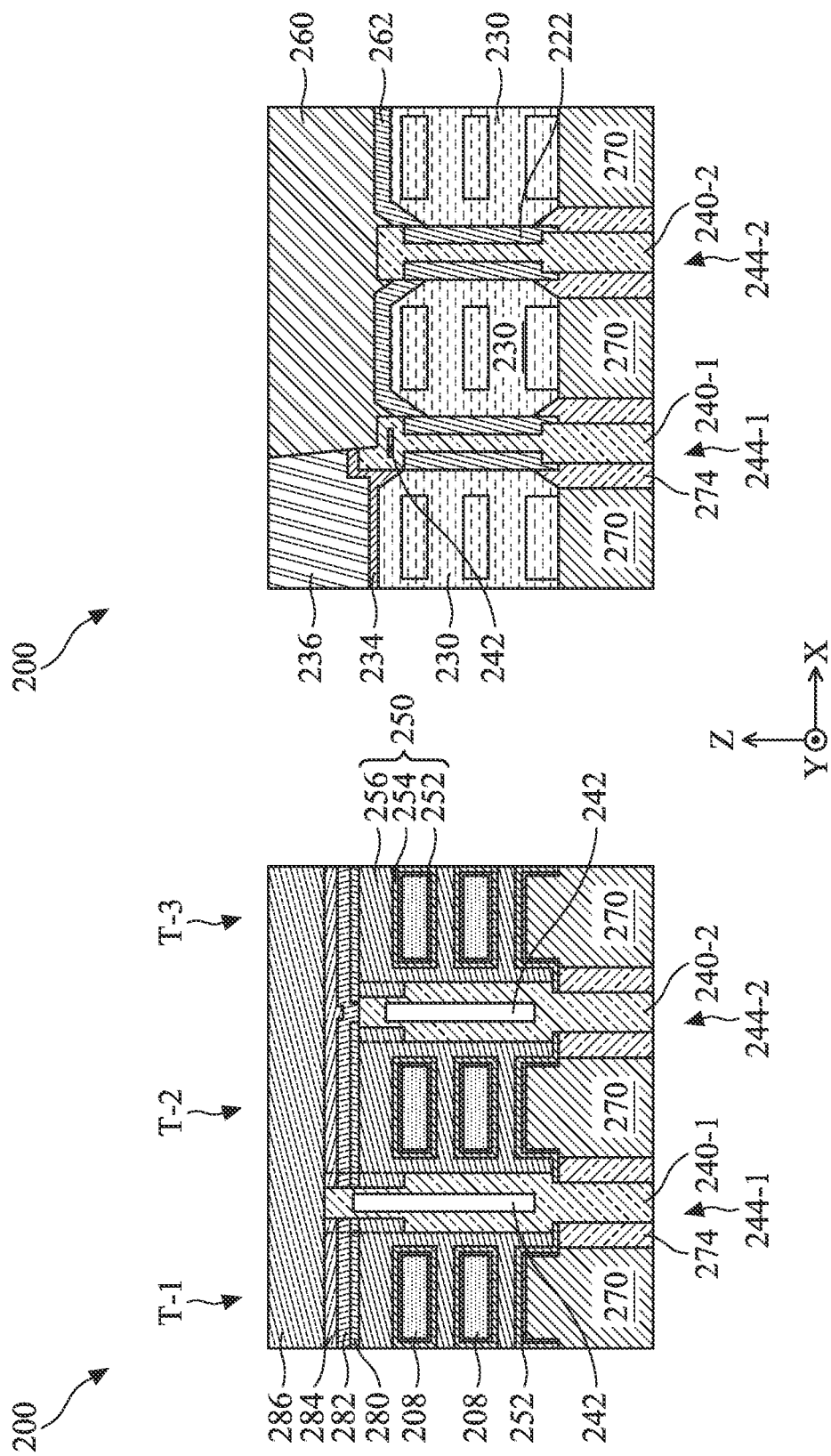

SEMICONDUCTOR DEVICE WITH GATE CUT FEATURE AND METHOD FOR FORMING THE SAME

PRIORITY DATA

This application claims priority to U.S. Provisional Patent Application No. 63/149,576, filed on Feb. 15, 2021, entitled "Semiconductor Device with Gate Cut Feature and Method for Forming the Same", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate metal-oxide-semiconductor field effect transistors (multi-gate MOSFETs, or multi-gate devices) have been introduced to improve gate control by increasing gate-channel coupling, reducing off-state current, and reducing short-channel effects (SCEs). A multi-gate device generally refers to a device having a gate structure (also known as gate stack), or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate structure on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

To continue to provide the desired scaling and increased density for MBC transistors in smaller technology nodes, dielectric fins (also known as hybrid dielectric fins or hybrid fins) have been introduced to provide isolation between gate structures. With further reducing gate critical dimensions (CDs), parasitic capacitance between gate structures may degrade device performance, such as circuit speed and cross-talk coupling, even with dielectric fins made of low-k dielectric material. Measures to improve isolation between gate structures of MBC transistors may face challenges in forming isolation structures while further reducing parasitic capacitance. While existing semiconductor devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, and 24A illustrate fragmentary cross-sectional views in a channel region of a workpiece during a fabrication process according to the method of FIGS. 1A-1C, according to one or more aspects of the present disclosure.

FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, and 24B illustrate fragmentary cross-sectional views in a source/drain region of a workpiece during a fabrication process according to the method of FIGS. 1A-1C, according to one or more aspects of the present disclosure.

DETAILED DESCRIPTION

Figure 1A:
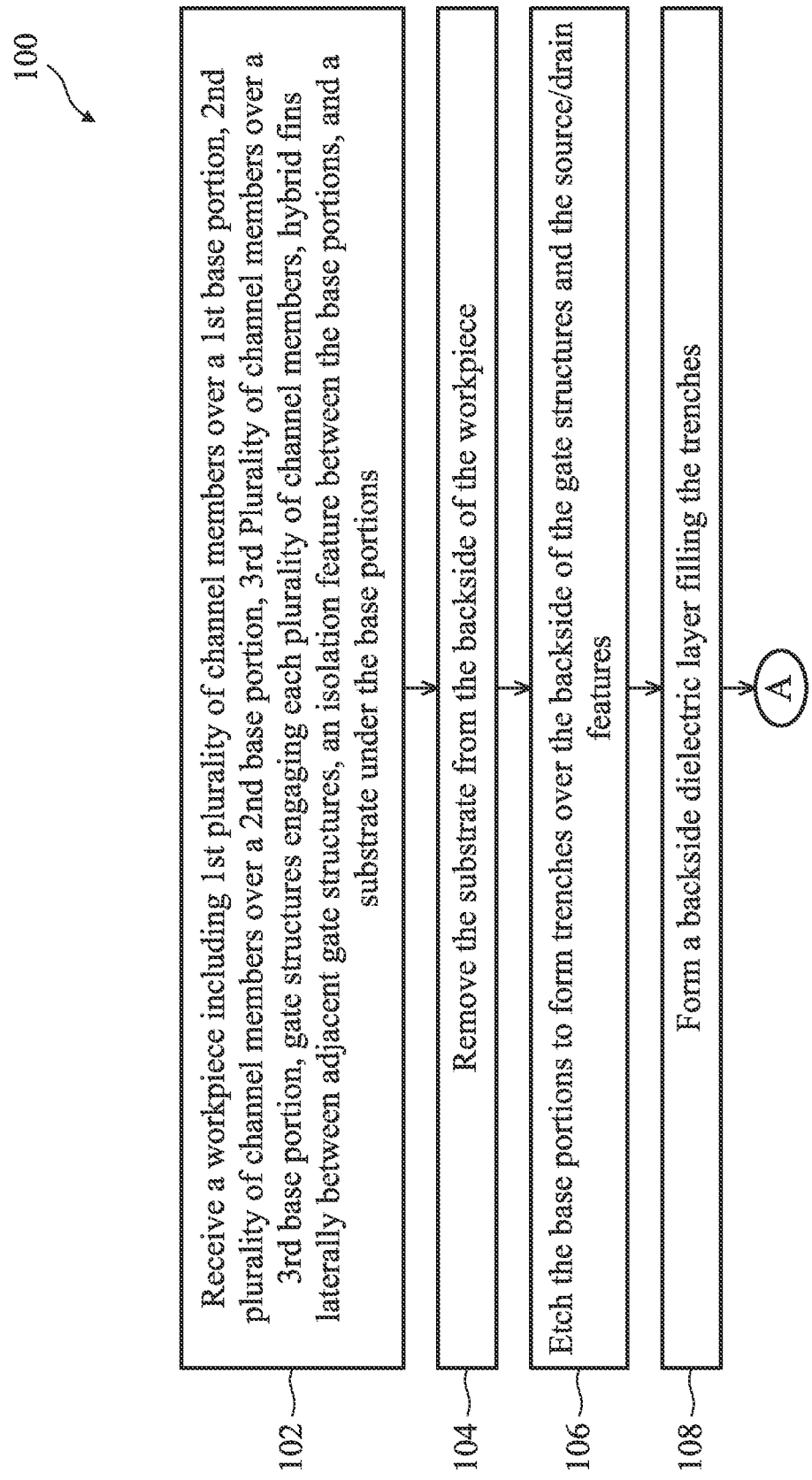
FIGS. 1A, 1B, and 1C illustrate a flow chart of a method for forming a semiconductor device with gate cut features formed from a backside of the semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In semiconductor fabrication, cut metal gate (CMG) process refers to a process for forming a dielectric feature to divide a continuous gate structure that spans over more than one active region into two or more segments. Such a dielectric feature may be referred to as a gate cut feature or a gate isolation feature. In some existing CMG processes, a gate cut feature is formed on a hybrid fin (also referred to as a dielectric fin). With the gate cut feature on top and the hybrid fin on bottom, they work in synergy to separate an otherwise continuous gate structure into segments. In some example processes, the gate cut feature is formed using photolithography and etch processes from a front side (or frontside) of a substrate (such as a wafer). As the scaling down of semiconductor device continues, it becomes increasingly difficult to form the gate cut feature squarely on a hybrid fin due to overlay and critical dimension uniformity (CDU) limitations. In some instances, the gate cut feature that misses the hybrid fin may cut into the gate structure or the channel region, resulting in defects.

Further, even though low-k dielectric material or extreme low-k dielectric material has been introduced to form hybrid fins, with further reducing gate CDs, parasitic capacitance still imposes a challenge to further device performance, such as circuit speed and cross-talk coupling. Besides using a low-k or extreme low-k dielectric material, another approach is to implement air gap(s), which is provided in the form of an air-gap-containing gate isolation feature. Even a small air gap near metal features may result in a significant improvement in an overall effective dielectric constant (k) reduction; for example, an air gap from about 35% to about 40% in volume between adjacent metal features may reduce parasitic capacitance by approximately 15%. As used herein, the term "air gap" is used to describe a void defined by surrounding substantive features, where a void may contain air, nitrogen, ambient gases, gaseous chemicals used in fabrication processes, or combinations thereof.

The present disclosure provides CMG processes that, unlike existing technologies, forms a gate isolation feature from a back side (or backside) of the substrate. Additionally, the gate isolation feature according to the present disclosure extends from the backside of the substrate through the gate structure. That is, the gate isolation feature of the present disclosure alone divides the gate structure into segments by replacing a hybrid fin. Processes of the present disclosure are not only formed from the backside but are also self-aligned to avoid defects associated with mask misalignment. Embodiments of the present disclosure may continue the scaling down of cell heights while maintaining or increasing the process window.

Figure 1B:
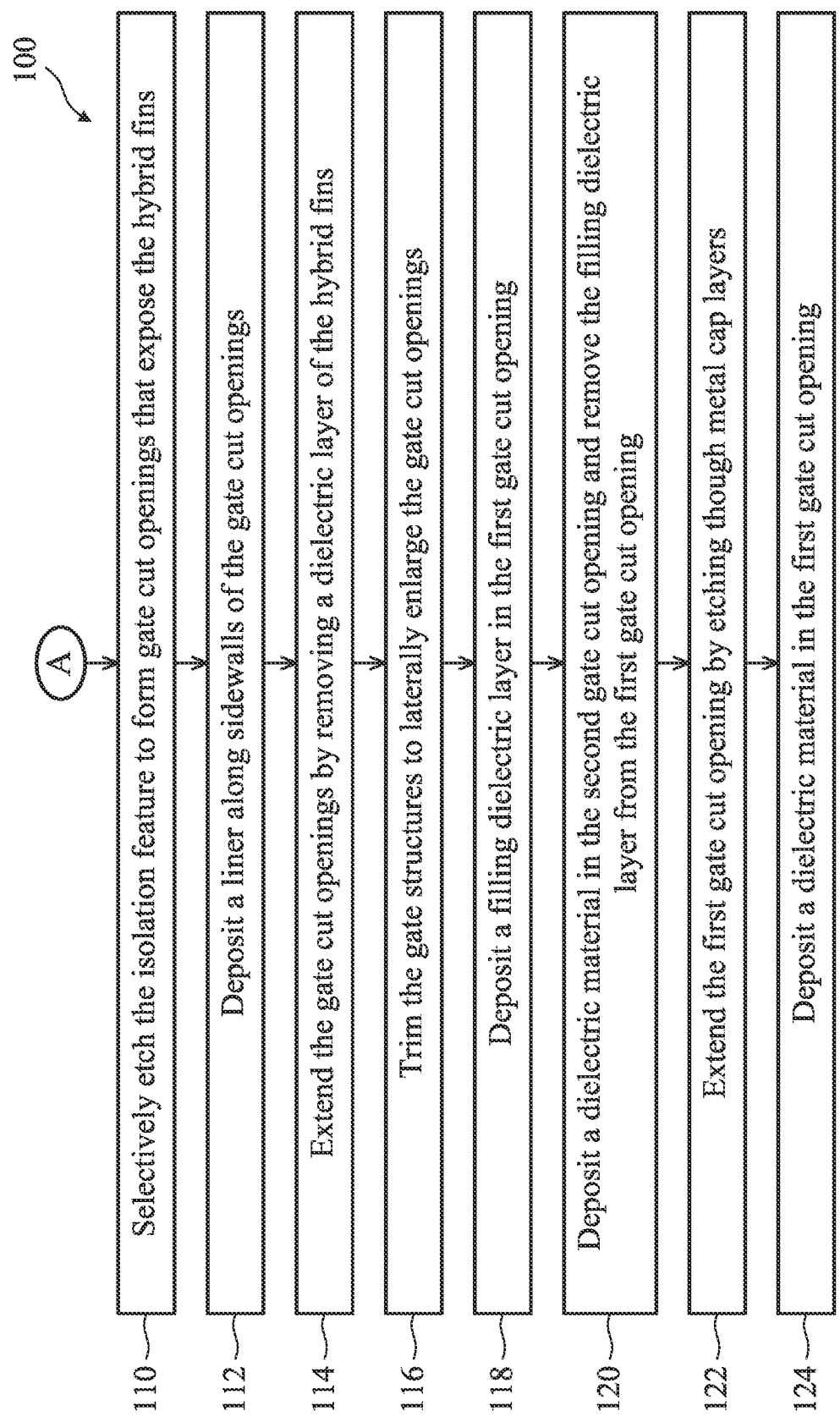
Figure 1C:
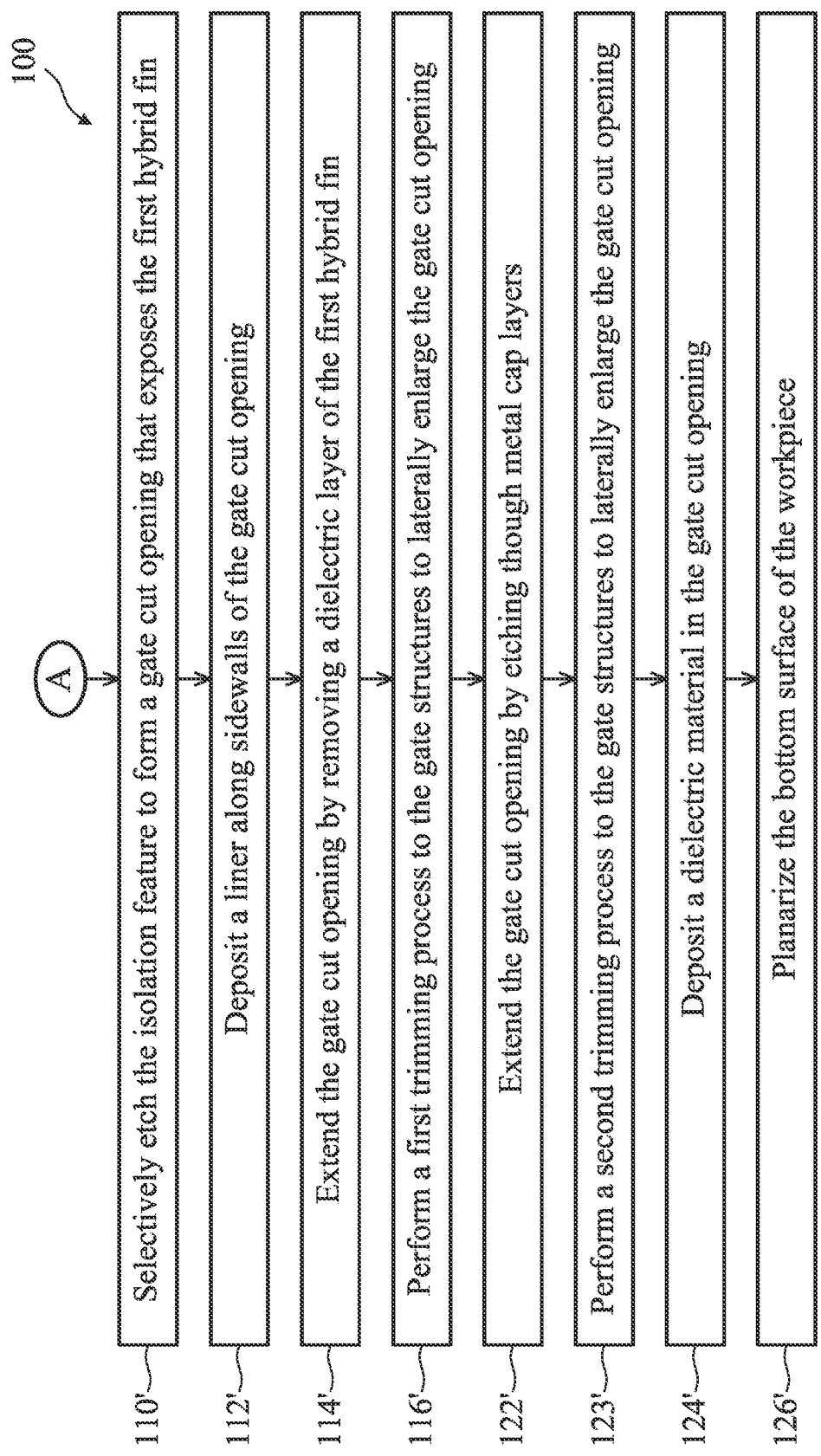

The various aspects of the present disclosure will now be described in more details with reference to the figures. In that regard, FIGS. 1A-1C is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during, or after method 100, and some steps described can be replaced, eliminated, or moved around for additional embodiments of the method. Not all steps are described herein in detail for reasons of simplicity. Method 100 is described below in conjunction with FIGS. 2A-24B, which are fragmentary perspective and cross-sectional views of a workpiece 200 at different stages of fabrication according to embodiments of method 100. Among FIGS. 2A-24B, figures ending with A are fragmentary cross-sectional views cut in a channel region; figures ending with B are fragmentary cross-sectional views cut in a source/drain (S/D) region abutting the channel region. Because the workpiece 200 will be fabricated into a semiconductor device upon conclusion of the fabrication processes, the workpiece 200 may be referred to as the semiconductor device (or device) 200 as the context requires. Additionally, like reference numerals denote like features throughout specification and drawings.

Embodiments of the present disclosure may be implemented to advance semiconductor devices that may include multi-gate devices. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. Embodiments of the present disclosure are described using an MBC transistor structure, which is for illustration purpose only and should not be construed as limiting the scope of the present disclosure; for example, the present disclosure may also be applicable to other multi-gate devices, including FinFET transistors.

Figures 2A, 2B:
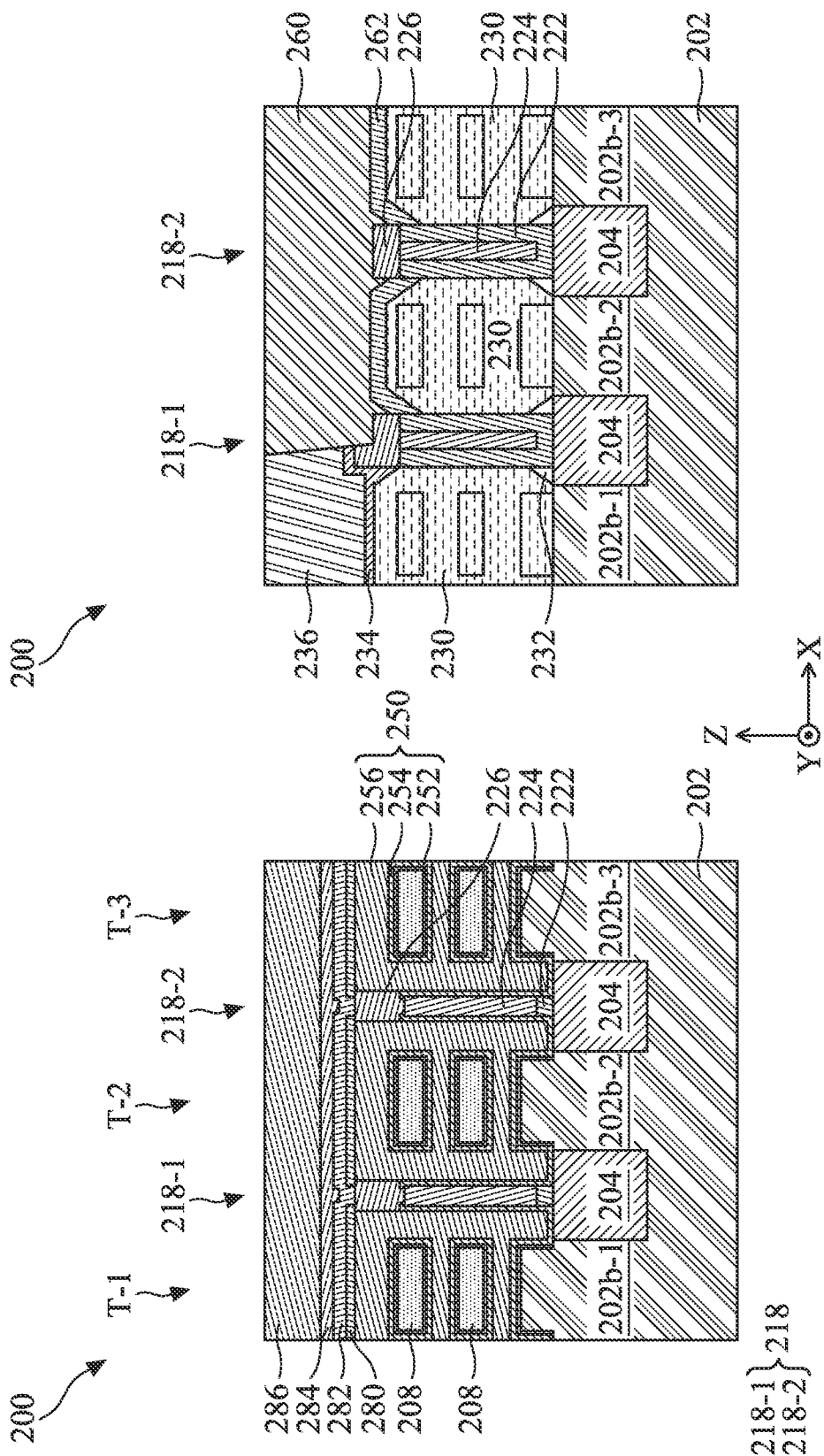

Referring to FIGS. 1A and 2A-2B, method 100 includes a block 102 where a workpiece 200 is received. FIGS. 2A-2B illustrate a workpiece 200 with its frontside facing up. No backside processes have been yet performed to the workpiece 200 shown in FIGS. 2A-2B. The workpiece 200 includes a substrate 202. In one embodiment, the substrate 202 includes silicon (Si). In other embodiments, the substrate 202 may also include other semiconductor materials such as germanium (Ge), silicon carbide (SiC), silicon germanium (SiGe), or diamond. The workpiece 200 includes a first base portion 202b-1, a second base portion 202b-2, and a third base portion 202b-3 (collectively referred to as the base portions 202b) extending continuously from a channel region (as in FIG. 2A) to adjacent S/D regions (as in FIG. 2B). Each of the base portions 202b is patterned from the substrate 202 and may share the same composition as the substrate 202. The base portions 202b are spaced apart from one another by an isolation feature 204. In some embodiments, the isolation feature 204 is deposited in trenches between the adjacent base portions 202b and surrounds each of the base portions 202b. The isolation feature 204 may also be referred to as a shallow trench isolation (STI) feature 204. The isolation feature 204 may include silicon oxide, silicon oxynitride, fluorine-doped silicate glass (FSG), a low-k dielectric, combinations thereof, and/or other suitable materials.

Referring to FIG. 2A, in the illustrated cross-sectional view of X-Z plane, three MBC transistors T-1, T-2, and T-3 separated by first hybrid fin 218-1 and second hybrid fin 218-2, respectively, are formed. Each MBC transistor includes a gate structure 250 engaging one or more channel members 208. In the depicted embodiment, the workpiece 200 includes a first plurality of vertically stacked channel members 208 over the first base portion 202b-1, a second plurality of vertically stacked channel members 208 over the second base portion 202b-2, and a third plurality of vertically stacked channel members 208 over the third base portion 202b-3. Each channel member 208 extends along the Y direction. The MBC transistors may also be referred to as nanosheet transistors. In some embodiments, each channel member 208 has a thickness ranging from about 4 nm to about 12 nm, and a lateral distance between two adjacent stacks (also approximately the distance between two adjacent base portions 202b) ranges from about 14 nm to about 50 nm. In the depicted embodiments, two (2) vertically stacked channel members 208 are disposed over each of the base portions 202b, which is for illustrative purposes only and not intended to be limiting beyond what is specifically recited in the claims. In some embodiments, the number of the channel members 208 stacked above each base portion 202b is between 2 and 8. The channel members 208 may be formed of a semiconductor material that is similar to the material of the substrate 202. In one embodiment, the channel members 208 may include silicon (Si).

Each gate structure 250 may include an interfacial layer 252 interfacing a respective base portion 202b and wrapping around the channel members 208, a gate dielectric layer 254 interfacing the isolation feature 204 and wrapping around the interfacial layer 252, and a gate electrode layer 256 wrapping around the gate dielectric layer 254. In some embodiments, the interfacial layer 252 includes silicon oxide. The gate dielectric layer 254 may also be referred to a high-K dielectric layer 254, as it is formed of a dielectric material having a dielectric constant greater than that of silicon dioxide, which is about 3.9 ($k \approx 3.9$). The gate dielectric layer 254 may include hafnium oxide. Alternatively, the gate dielectric layer 254 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The gate electrode layer 256 may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Referring to FIGS. 2A and 2B, in the depicted embodiment, the workpiece 200 includes a first hybrid fin 218-1 separating the MBC transistors T-1 and T-2 and a second hybrid fin 218-2 separating the MBC transistors T-2 and T3. The hybrid fins 218-1 and 218-2 are collectively referred to as the hybrid fins 218. Each hybrid fin 218 extends from the channel region to the S/D region along the Y direction. In the channel region (as in FIG. 2A), each hybrid fin 218 includes a first dielectric layer 222 disposed over the isolation feature 204, a second dielectric layer 224 stacked over the first dielectric layer 222, and a third dielectric layer 226 stacked over the second dielectric layer 224. In some instances, dielectric constants of the first dielectric layer 222 and the second dielectric layer 224 are both smaller than that of the third dielectric layer 226. The first dielectric layer 222 may include a nitride, such as silicon carbonitride (SiCN), silicon oxycarbide (SiOC), silicon oxycarbonitride (SiOCN), or other suitable nitride material. The second dielectric layer 224 may include an oxide, such as aluminum oxide, aluminum oxynitride, zirconium oxide, zirconium aluminum oxide, or other suitable oxide material. The third dielectric layer 226 includes a high-K dielectric material and is also referred to as the high-K dielectric layer 226. In some embodiments, the high-K dielectric layer 226 may include hafnium oxide ($HfO_2$), zirconium oxide ($ZrO_2$), hafnium aluminum oxide ($HfAlO_x$), hafnium silicate ($HfSiO_x$), aluminum oxide ($Al_2O_3$), or other suitable high-K dielectric material (e.g., $k>7$). As a comparison, in the S/D region (as in FIG. 2B), the first dielectric layer 222 is not just under the second dielectric layer 224 but also over sidewalls of the second dielectric layer 224 and further in contact with a bottom surface of the high-K dielectric layer 226. This is due to a hybrid fin thinning process in the channel region that selectively removes the first dielectric layer 222 (e.g., by an etchant targeting at nitride) from sidewalls of the second dielectric layer 224 in an effort to enlarge a gate trench to facilitate depositing the different material layers of the gate structures 250. After the selectively removing of the first dielectric layer 222 from sidewalls of the second dielectric layer 224 in the channel region (as in FIG. 2A), the gate dielectric layer 254 is directly deposited on the exposed sidewalls of the second dielectric layer 224. Yet in an alternative embodiment, the hybrid fin thinning process is optional and skipped, such that the first dielectric layer 222 covers sidewalls of the second dielectric layer 224 in both the channel region and the S/D region. In such an alternative embodiment, the gate dielectric layer 254 would be directly deposited on sidewalls of the first dielectric layer 222 in the channel region.

The workpiece 200 also includes a first metal cap layer 280, a second metal cap layer 282, a dielectric cap layer 284, and a self-aligned cap (SAC) layer 286 formed on the frontside of the workpiece 200. The first metal cap layer 280 is selectively grown on the top surfaces of the gate electrode layer 256 but not on the hybrid fins 218. In some embodiments, the first metal cap layer 280 includes fluorine-free tungsten (FFW). The second metal cap layer 282 covers the first metal cap layer 280 and the hybrid fins 218. In some embodiments, the second metal cap layer 282 includes tungsten (W) and is deposited by PVD. The metal cap layers 280 and 282 prevent the dielectric materials deposited above from contacting work function metals in the gate electrode layer 256. Further, as being conductive layers, the metal cap layers 280 and 282 provide electrical coupling between the gate structures 250 of the three MBC transistors T-1, T-2, T-3. The dielectric cap layer 284 covers the second metal cap layer 282. In some embodiments, the dielectric cap layer 284 includes a nitride, such as silicon nitride, silicon carbonitride, or other suitable nitride material. The SAC layer 286 covers the dielectric cap layer 284. The SAC layer 286 may be a single layer or a multi-layer and may include silicon oxide, silicon nitride, silicon carbide, silicon oxynitride, silicon carbonitride, silicon oxycarbide, silicon oxycarbonitride, and/or combinations thereof.

Referring to FIG. 2B, with respect to the base portions 202*b*, each vertical stack of the channel members 208 extends in the Y direction between a source feature and a drain feature (collectively as the source/drain features 230, or the S/D features 230). The S/D features 230 are directly disposed on the respective base portions 202*b*. Depending on the conductivity type of the MBC transistors, the S/D features 230 may be n-type or p-type. When the S/D features 230 are n-type, they may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). When the S/D features 230 are p-type, they may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). Facets of the S/D features 230 may trap voids 232 between the S/D features 230 and adjacent dielectric features, such as the hybrid fins 218 and the isolation feature 204.

Still referring to FIG. 2B, the workpiece 200 also includes a contact etch stop layer (CESL) 234 disposed over the S/D features 230, and an interlayer dielectric (ILD) layer 236 disposed over the CESL 234. The CESL 234 may include silicon nitride, silicon oxynitride, and/or other materials known in the art. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The workpiece 200 also includes frontside S/D contact 260 over S/D features 230. In the depicted embodiment, the S/D contact 260 lands on and electrically connects the two S/D features 230 over the base portions 202*b*-2 and 202*b*-3. The S/D contact 260 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), or a combination thereof. The thickness of the S/D contact 260 may range from about 1 nm to about 50 nm. The workpiece 200 may also include a silicide feature 262 between the S/D contact 260 and the S/D features 230 to further reduce contact resistance. The silicide feature 262 may be formed by depositing into a S/D contact hole followed by an annealing process to cause reaction between the one or more metals and the S/D features 230 to produce the silicide feature. The one or more metals may include nickel (Ni), cobalt (Co), titanium (Ti), tantalum (Ta), platinum (Pt), tungsten (W), ytterbium (Yb), iridium (Ir), erbium (Er), other noble metals, other refractory metals, rare earth metals, or a combination thereof (e.g., an alloy of two or more metals) and may be deposited using CVD, PVD, ALD, or other suitable methods. The silicide feature 262 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. The thickness of the silicide feature 262 may range from about 1 nm to about 10 nm. Alternatively, the silicide formation may be skipped and the S/D contact 260 directly contacts the S/D feature 230.

Figures 3A, 3B:
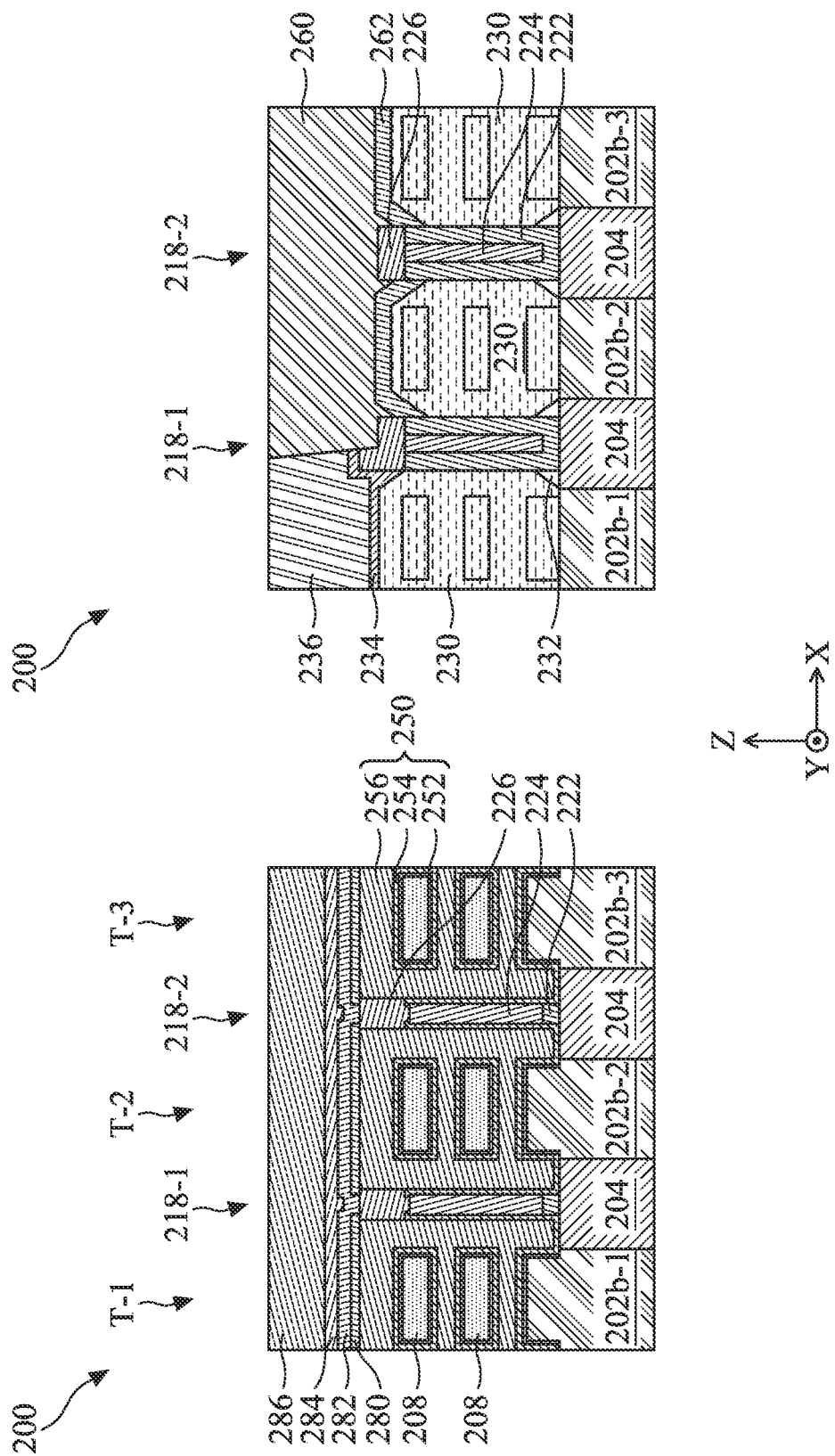
Figures 4A, 4B:
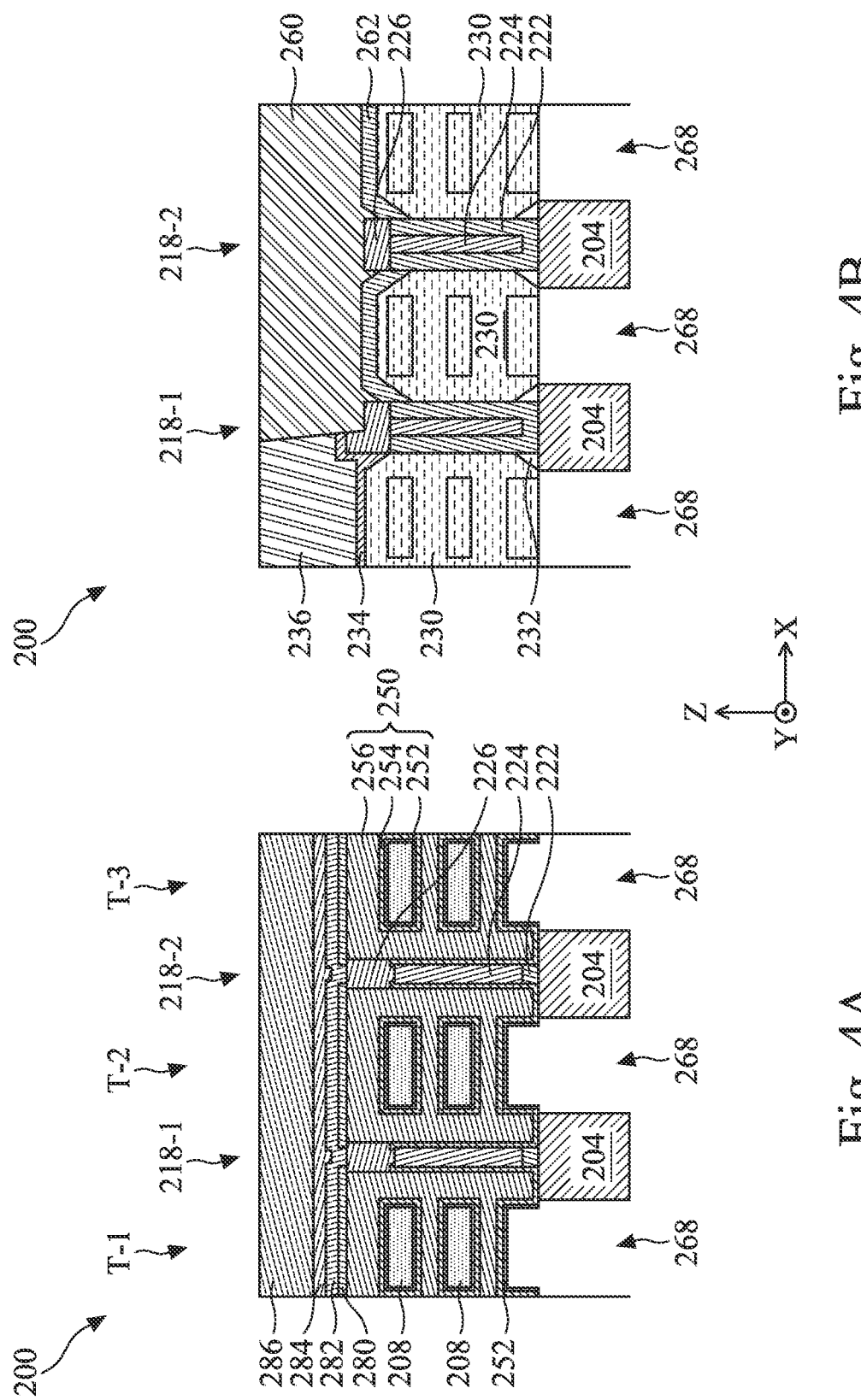

Referring to FIGS. 1A and 3A-3B, method 100 includes a block 104 where the workpiece 200 is processed from the backside in removing the substrate 202. FIGS. 3A-3B and the following figures still illustrate the workpiece 200 with its frontside facing up for the sake of simplicity. But the processes may include a flipping process that first flips the workpiece 200 upside down and followed by subsequent processes applied towards the backside of the workpiece 200. That is, although the workpiece 200 is still illustrated with the frontside facing up in FIGS. 3A-24B, in the process flow it may actually be flipped upside down to receive respective processes towards the backside of the workpiece 200. To flip the workpiece 200 up-side-down, a carrier substrate (not depicted) may be bonded to the frontside of the workpiece 200 away from the substrate 202. In some embodiments, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 includes a top oxide layer. After both the bottom oxide layer and top oxide layer are treated, they are placed in plush contact with one another for direct bonding at room temperature or at an elevated temperature. Once the carrier substrate is bonded to the workpiece 200, the workpiece 200 is flipped over. The carrier substrate is also omitted from the following figures for simplicity. After the workpiece 200 is flipped over, the backside of the workpiece 200 is planarized using chemical mechanical polishing (CMP) until the substrate 202 is removed and the isolation feature 204 and the base portions 202*b* are exposed on the backside of the workpiece 200.

Referring to FIGS. 1A and 4A-4E, method 100 includes a block 106 where the base portions 202*b* are selectively etched to form trenches 268, exposing the backside of the gate structures 250 (e.g., the interfacial layer 252). The trenches 268 extend along the Y direction into the S/D regions and also expose bottom surfaces of the S/D features 230. In some embodiments, operations at block 106 apply an etching process that is tuned to be selective to the materials of the semiconductor material (e.g. silicon) in the base portions 202*b* and with no (or minimal) etching to the gate structures 250 (e.g., the interfacial layer 252), the isolation feature 204, and the S/D features 230. The channel members 208 remain unexposed in the trenches 268. Further, the voids 232 may remain trapped and unexposed in the trenches 268 as well. The etching process can be dry etching, wet etching, reactive ion etching, or other etching methods.

Figures 5A, 5B:
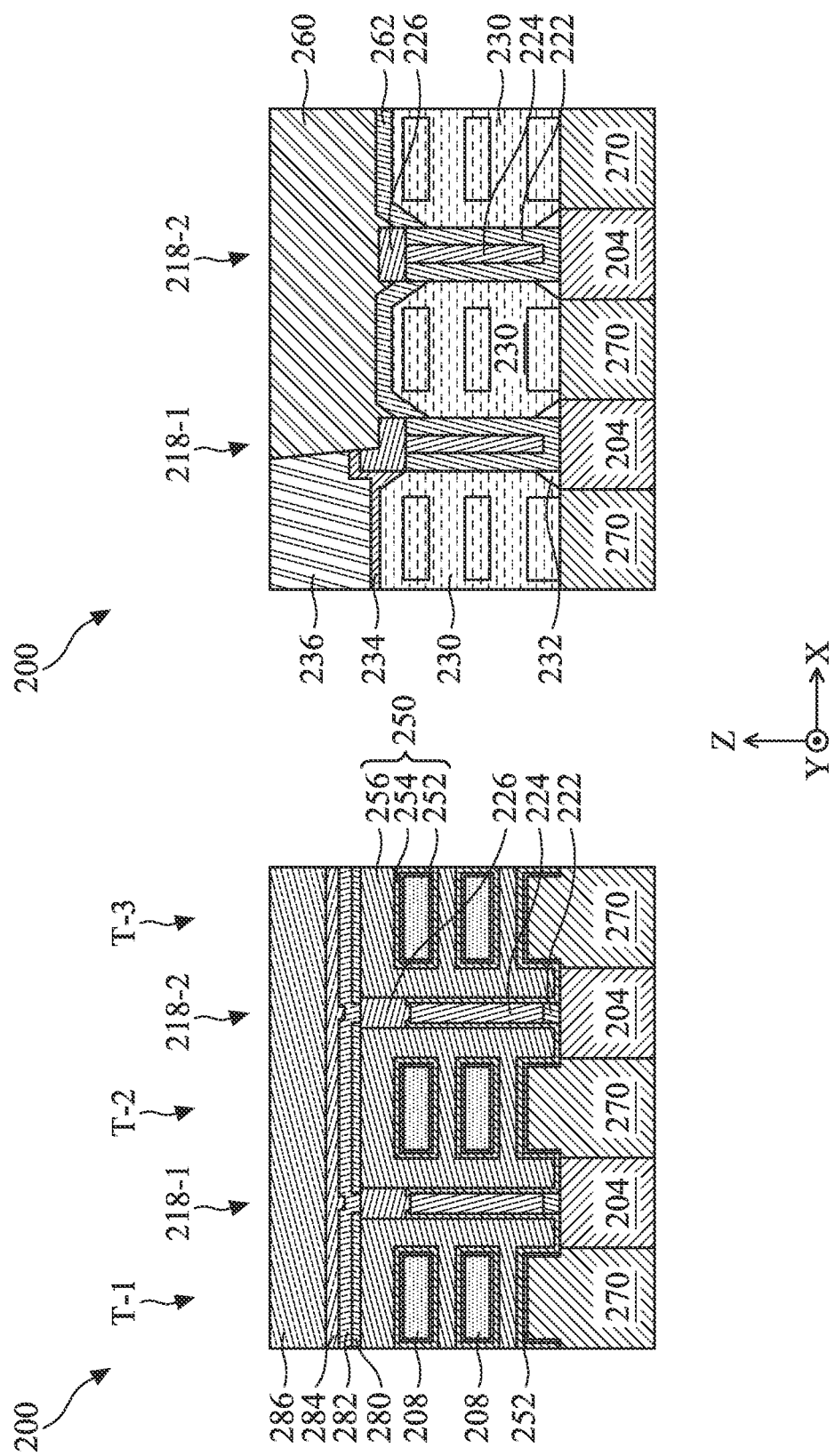

Referring to FIGS. 1A and 5A-5B, method 100 includes a block 108 where a backside dielectric layer 270 with one or more dielectric materials are deposited to fill the trenches 268 and cover the exposed bottom surfaces of the gate structures 250 and the source/drain features 230. In some embodiments, the backside dielectric layer 270 may include one or more of dielectric material with dielectric constant less than 7 (k<7), such as $SiO_2$, SiN, SiCN, SiOC, SiOCN, other suitable material(s), or combinations thereof, and may be formed by PE-CVD, F-CVD or other suitable methods. Further, in the present embodiment, the backside dielectric layer 270 and the isolation feature 204 may include different materials so that the isolation feature 204 may act as a CMP stop when the backside dielectric layer 270 is planarized by the CMP process to expose the isolation feature 204. At the conclusion of operations at block 108, semiconductor material(s) of the base portions 202b is replaced by dielectric material(s) of the backside dielectric layer 270, which reduces capacitance in the device and avoids leakage from the substrate.

Figures 6A, 6B:
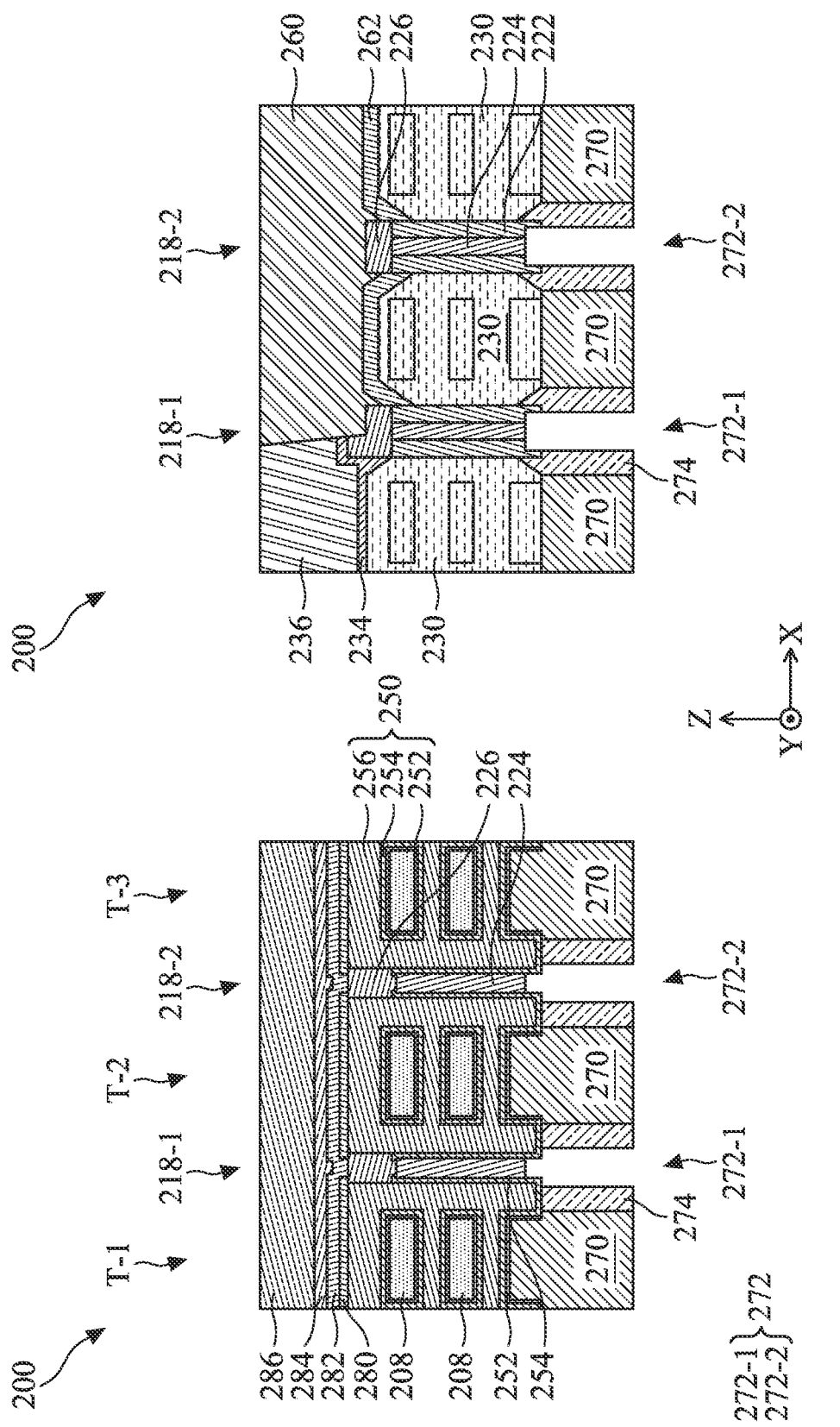

Referring to FIGS. 1B and 6A-6B, method 100 includes a block 110 where the isolation feature 204 is selectively etched to form trenches, namely a first gate cut opening 272-1 exposing a bottom surface of the first hybrid fin 218-1 and a second gate cut opening 272-2 exposing a bottom surface of the second hybrid fin 218-2. The first gate cut opening 272-1 and the second gate cut opening 272-2 are collectively referred to as the gate cut openings 272. In some embodiments, the isolation feature 204 is selectively and anisotropically etched to form the gate cut openings 272. The isolation feature 204 may be etched using a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIGS. 6A and 6B, operations at block 110 also remove portions of the first dielectric layer 212 of the hybrid fins 218 that are directly under the second dielectric layer 224. That is, the gate cut openings 272 may terminate on bottom surfaces of the second dielectric layer 224. Operations at block 110 may apply more than one etching processes. For example, it may apply a first etching process to selectively remove the isolation feature 204, and then apply a second etching process with different etchant(s) to selectively remove portions of the first dielectric layer 212 of the hybrid fins 218. As depicted in FIG. 6A, portions of the gate dielectric layer 254 are exposed in the gate cut opening openings 272.

Still referring to FIGS. 1B and 6A-6B, method 100 includes a block 112 where a liner 274 is deposited along sidewalls of the gate cut openings 272 and reduces the size of the gate cut openings 272. In the depicted embodiment, the liner 274 covers the exposed facets of the S/D features 230 and fills the voids 232. The liner 274 functions to protect the S/D features 230 from subsequent etching processes. By filling the voids 232, a top portion of the liner 274 may be higher than a bottom portion of the first dielectric layer 222. The liner 274 may be a single layer or a multi-layer. In some instances, the at least one dielectric material for the liner 274 may include silicon, oxygen, nitrogen, or carbon. For example, the at least one dielectric material may include silicon nitride, silicon carbonitride, silicon oxycarbonitride, silicon oxycarbide, or silicon oxynitride. The liner 274 may have a thickness between about 2 nm and about 10 nm. If the thickness of the liner 274 is less than about 2 nm, it may not effectively cover the S/D features 230. If the thickness of the liner 274 is larger than about 10 nm, the size of the gate cut openings 272 may shrink too much, which increases difficulties in removing the hybrid fins from the gate cut openings 272 in subsequent processes.

Figures 7A, 7B:
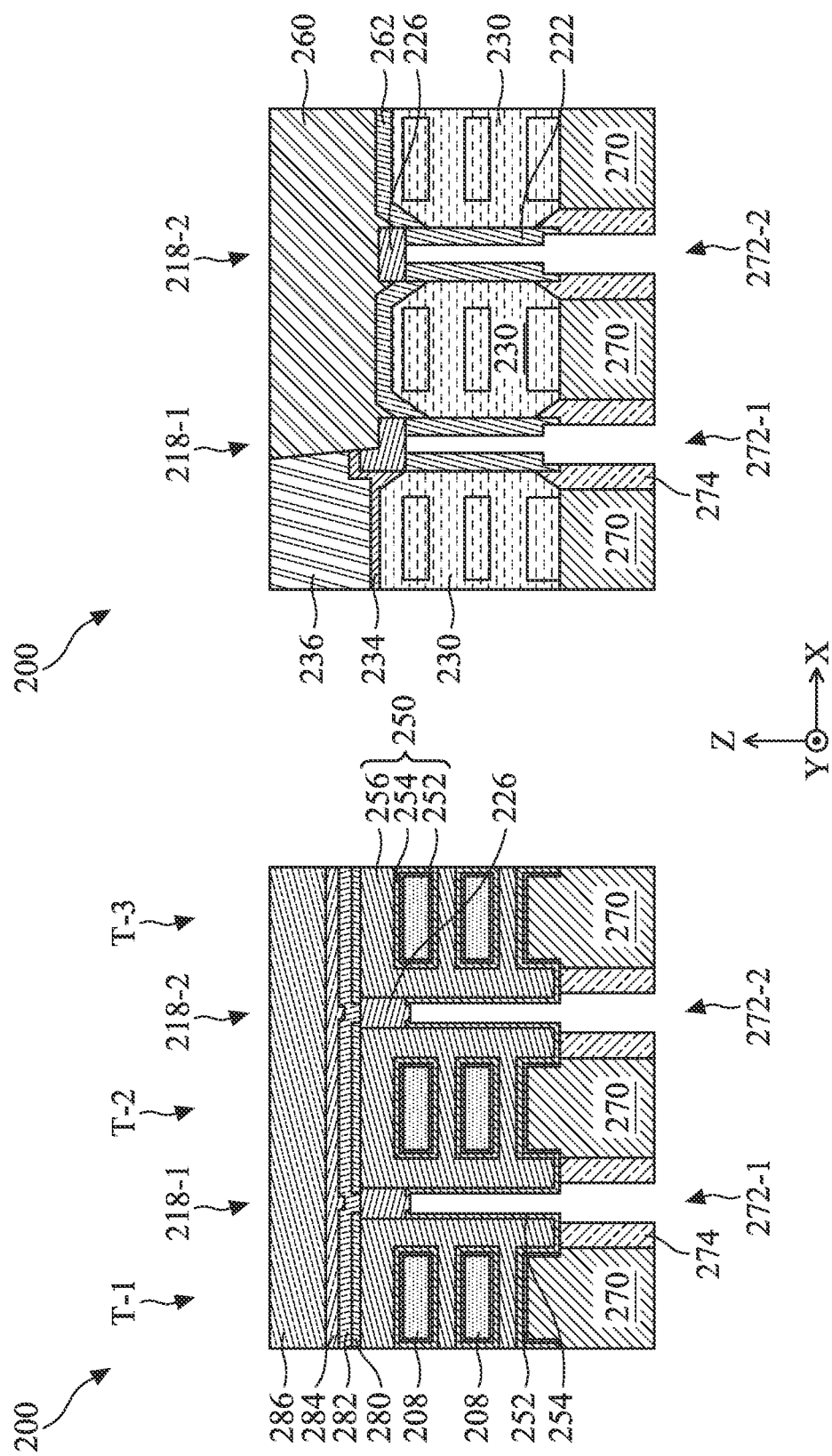

Referring to FIGS. 1B and 7A-7B, method 100 includes a block 114 where the gate cut openings 272 are extended towards the frontside of the workpiece 200 by removing the second dielectric layer 224 from the hybrid fins 218. In some embodiments, operations at block 114 apply an etching process that is tuned to be selective to the materials of the second dielectric layer 224 and with no (or minimal) etching to the gate dielectric layer 254, the first dielectric layer 222, the third dielectric layer 226, and the liner 274. That is, the gate cut openings 272 may terminate on bottom surfaces of the third dielectric layer 226 of the hybrid fins 218. The etching process can be dry etching, wet etching, reactive ion etching, or other etching methods.

Referring to FIGS. 1B and 8A-8B, method 100 includes a block 116 where the gate structures 250 are trimmed to laterally enlarge the gate cut openings 272 between adjacent gate structures 250. In some embodiments, operations at block 116 apply an etching process that is tuned to be selective to the materials of the gate dielectric layer 254 and with no (or minimal) etching to the gate electrode layer 256, such that the exposed portions of the gate dielectric layer 254 are removed. The removing of the exposed portions of the gate dielectric layer 254 enlarges the width of the gate cut openings 272 in the X direction, which in turn enlarges lateral distance between adjacent gate structures 250 and thus reduces parasitic capacitance. In some embodiments, operations at block 116 also apply a second etching process that is tuned to be selective to the materials of the gate electrode layer 256, which further enlarges lateral distance between gate structures 250. Each of the first and second etching processes can be dry etching, wet etching, reactive ion etching, or other etching methods. In some instances, the first and second etching processes are both isotropic etching. At the conclusion of block 116, in the channel region (as in FIG. 8A) each gate cut opening 272 has a wider top portion laterally between two adjacent gate structures 250 and a narrower bottom portion laterally between the liner 274. As a comparison, in the S/D region (as in FIG. 8B) each gate cut opening 272 has a narrower top portion laterally between two adjacent S/D features 230 and a wider bottom portion laterally between the liner 274. The etching process applied at block 116 may also slightly etch into bottom surfaces of the third dielectric layer 226. In some embodiments, in the channel region, a thickness of the remaining portion of the third dielectric layer 226 ranges from about 5 nm to about 26 nm. As a comparison, in the S/D region, due to the formation of the S/D contact 260, the thickness of the remaining portion of the third dielectric layer 226 is smaller, ranging from about 0.5 nm to about 16 nm. In one instance, in the S/D region, the bottom surface of the third dielectric layer 226 in the second gate cut opening 272-2 has a concave profile, bending upwardly towards the frontside of the workpiece 200.

Figures 9A, 9B:
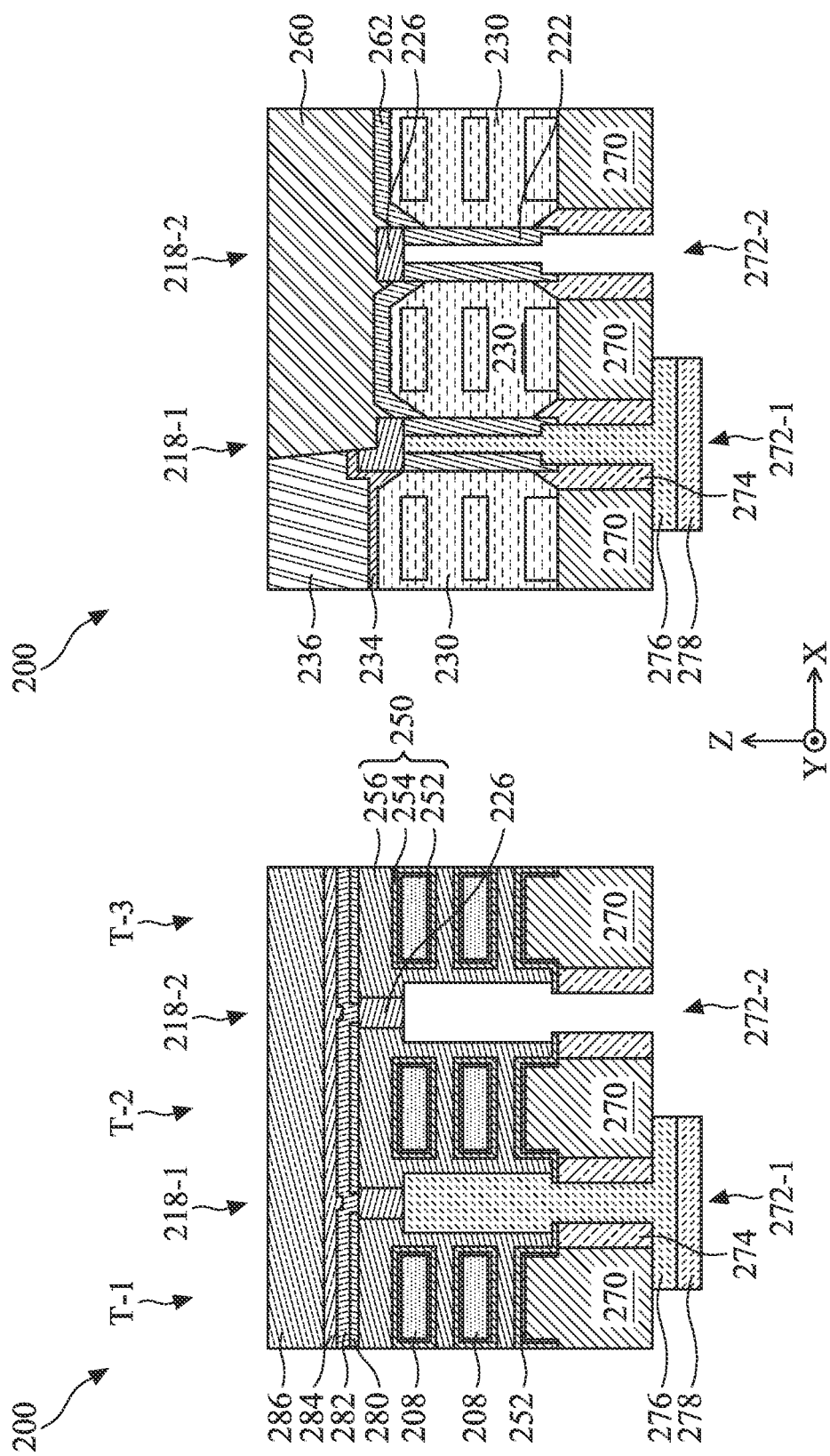

Referring to FIGS. 1B and 9A-9B, method 100 includes a block 118 where a filling dielectric layer 276 is deposited in the first gate cut opening 272-1 filling the first gate cut opening 272-1, while the second gate cut opening 272-2 remains open. In an example process, polymer-like material, such as spin-on-glass (SOG) which can be easily removed in subsequent processes, is deposited on the backside of the workpiece 200 using CVD, filling both the first gate cut opening 272-1 and the second gate cut opening 272-2. Subsequently, a hard mask layer is blanketly deposited over the backside of the workpiece 200. After the deposition of the hard mask layer, photolithography and etch processes may be performed to pattern the hard mask layer to form a patterned hard mask 278. In some instances, a photoresist layer is deposited over the hard mask layer. To pattern the photoresist layer, the photoresist layer is exposed to radiation reflected from or transmitting through a photomask, baked in a post-exposure bake process, and developed in a developer. The patterned photoresist layer is then applied as an etch mask to etch the hard mask layer, thereby forming the patterned hard mask 278. Referring to FIGS. 9A-9B, the patterned hard mask 278 includes a mask opening over the second gate cut opening 272-2. According to the present disclosure, the patterned hard mask 278 functions to mask portions of the polymer-like material over the first gate cut opening 272-1 that is not to be etched. Operations at block 118 subsequently remove the polymer-like material from the second gate cut opening 272-2 in an etch process. The portions of the polymer-like material protected under the patterned hard mask 278 remains in the first gate cut opening 272-1 as the filling dielectric layer 276.

Figures 10A, 10B:
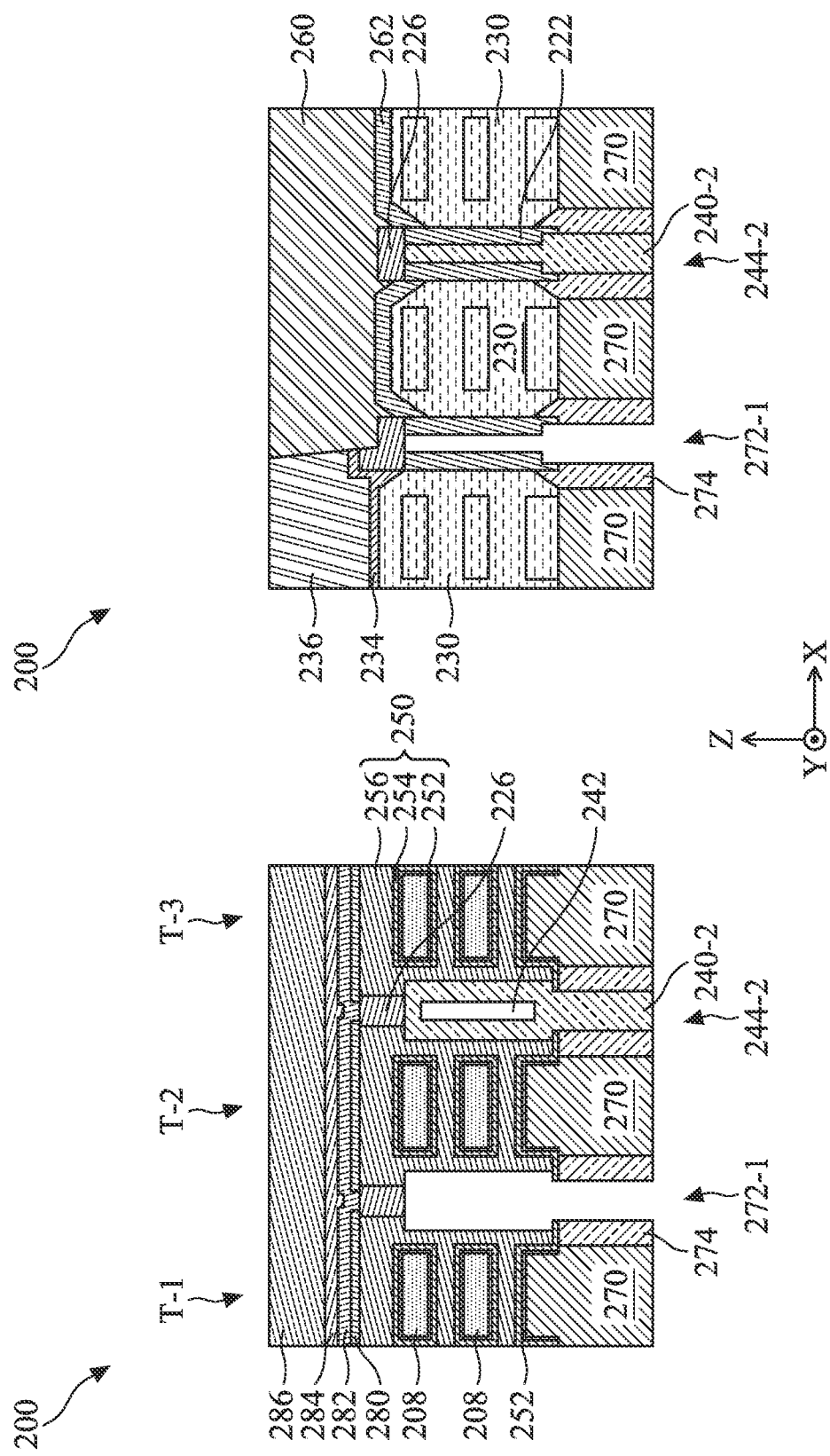

Referring to FIGS. 1B and 10A-10B, method 100 includes a block 120 where a dielectric material is deposited in the second gate cut opening 272-2 to form a seal layer 240-2. In some embodiments, the seal layer 240-2 is formed of a low-k dielectric material to reduce parasitic capacitance between adjacent gate structures 250 as well as between adjacent S/D features 230. The dielectric material for the seal layer 240-2 may be deposited using plasma-enhanced CVD (PECVD), high-density-plasma CVD (HDPCVD), or CVD. In some instances, the dielectric material for the seal layer 240 may include silicon nitride, silicon carbonitride, silicon oxycarbonitride, silicon oxycarbide, or silicon oxynitride. In an embodiment, the low-k dielectric material is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains an air gap 242 in the relatively wider portions of the second gate cut opening 272-2 in the channel region (as in FIG. 10A), without entirely filling it. In the present embodiment, the PE-CVD process employs a setting with pressure less than about 0.75 torr and temperature higher than about 75° C. (but less than about 450° C. to avoid damaging metal features on the frontside of the workpiece 200). Hence, the low-k dielectric material may enclose the second gate cut opening 272-2 without a significant amount being deposited in the space and keep the air gaps 242 laterally between two adjacent gate structures 250. As a comparison, the second gate cut opening 272-2 in the S/D region may be substantially fully filled due to the relatively narrower space. That is, the air gap 242 may be limited in the channel region and do not extend continuously from a channel region to abutting S/D regions. A gas, such as a gas(es) used during the deposition of the dielectric material of the seal layer 240-2 or any other species that can diffuse into the air gap 242, may be in the air gap 242. Operations at block 120 may include performing a planarization process, such as a CMP process, to the seal layer 240-2 to remove excessive dielectric materials (including excessive dielectric materials from the filling dielectric layer 276 and the patterned hard mask 278) from the backside of the workpiece 200 and expose the backside dielectric layer 270. Operations at block 120 further remove the filling dielectric layer 276 in a selective etching process, exposing the first gate cut opening 272-1 again from the backside of the workpiece 200. The air-gap-containing seal layer 240-2 collectively with the remaining portions of the third dielectric layer 226 of the hybrid fin 218-2 collectively defined a gate isolation feature 244-2 disposed laterally between the adjacent gate structures 250 in the channel region and between the adjacent S/D features 230 in the S/D region. To be noticed, at the conclusion of block 120, the gate structures 250 of the three MBC transistors T-1, T-2, T-3 remain electrically connected through the metal cap layers 280 and 282 from the frontside of the workpiece 200.

Figures 11A, 11B:
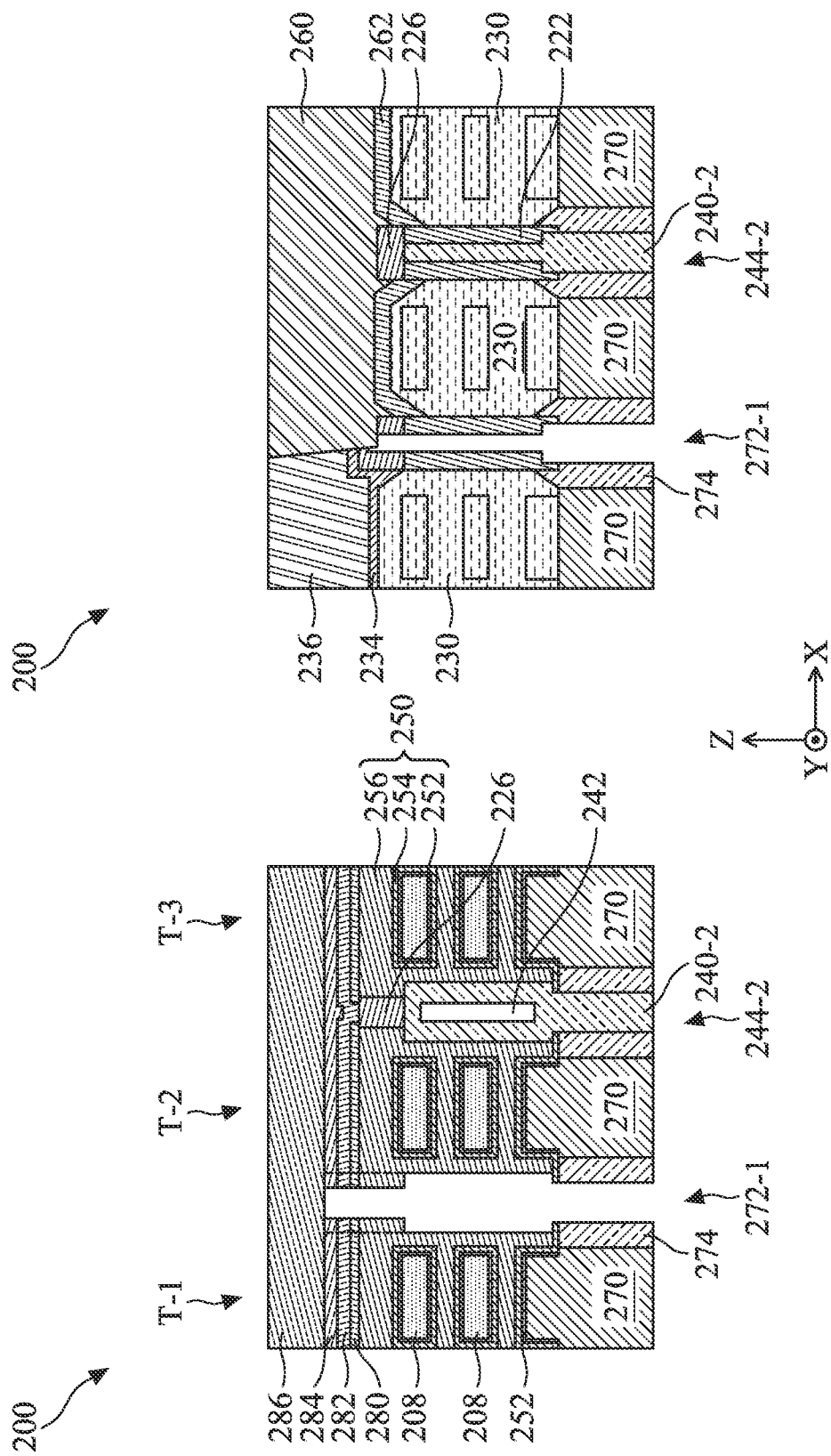

Referring to FIGS. 1B and 11A-11B, method 100 includes a block 122 where an etching process is performed to further extend the first gate cut opening 272-1 towards the frontside of the workpiece 200. In an example process, the etching process includes an isotropic or anisotropic etching process that is tuned to be selective to the materials of the third dielectric layer 262 and with no (or minimal) etching to the seal layer 240-2 that fills the second gate cut opening 272-2, the liner 274, the gate electrode 256, and the metal cap layers 280 and 282. The etching process further includes an anisotropic etching process that is tuned to be selective to the conductive materials of the metal cap layers 280 and 282. In some implementations, the anisotropic etch process may be a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. The dielectric cap layer 284 functions as an etch stop layer. In the depicted embodiment, the first gate cut opening 272-1 terminates on or in the dielectric cap layer 284 in the channel region (as in FIG. 10A). In the S/D region, the first gate cut opening 272-1 exposes a bottom surface of the S/D contact 260 (as in FIG. 10B). Further, in the S/D region, sidewalls of the extended top portion and middle portion of the first gate cut opening 272-1 may be substantially flush. As a comparison, due to the trimming of the gate structures 250 at block 116, the extended top portion of the first gate cut opening 272-1 in the channel region is narrower than its middle portion, but still wider than the extended top portion in the S/D region. In an alternative embodiment, operations at the block 122 includes an anisotropic etching process that also removes a portion of the gate electrode 256 such that sidewalls of the extended top portion and middle portion of the first gate cut opening 272-1 may be substantially flush as well in the channel region, as represented by the dotted lines in FIG. 11A.

Figures 12A, 12B:
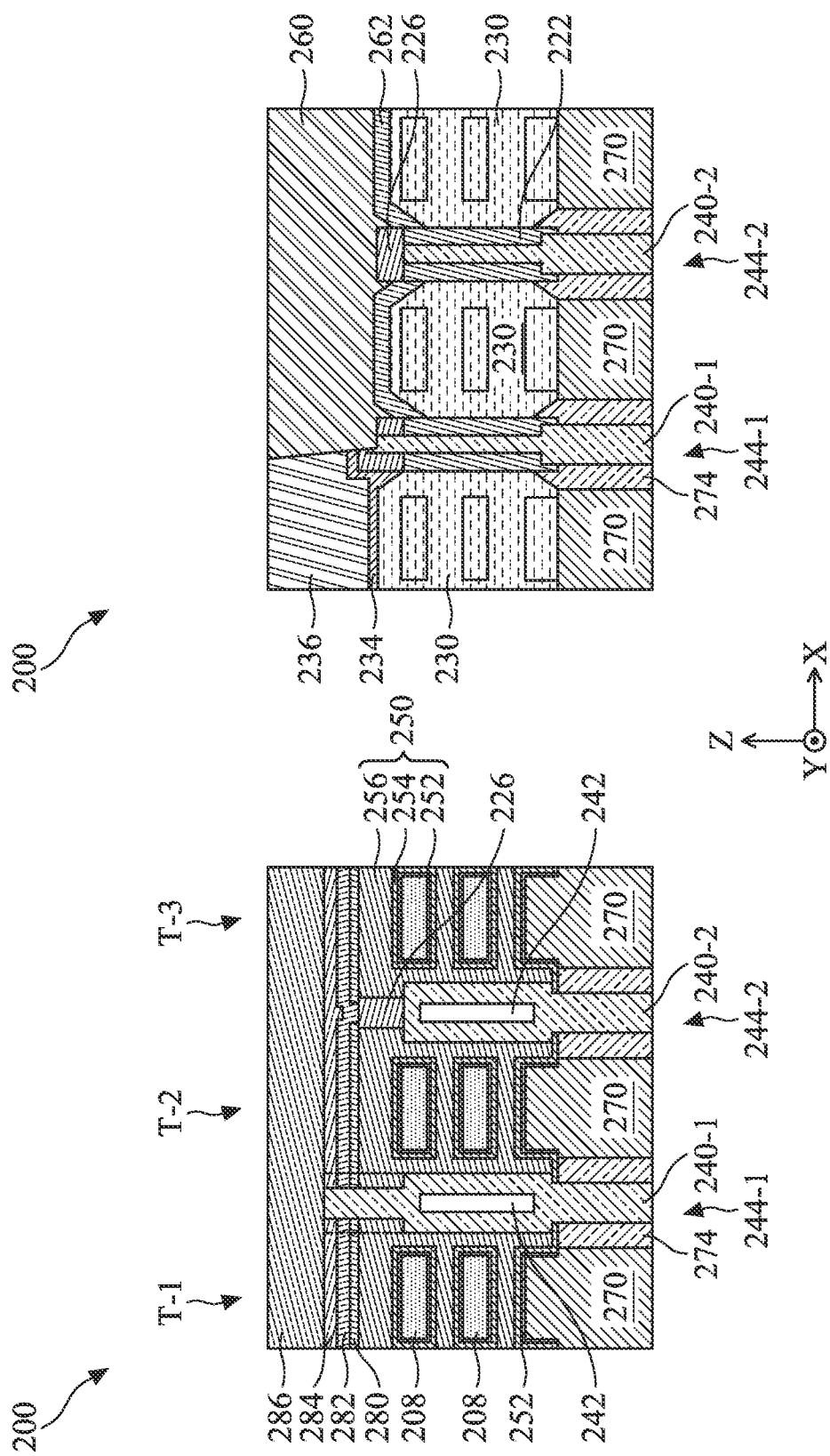

Referring to FIGS. 1B and 12A-12B, method 100 includes a block 124 where a dielectric material is deposited in the first gate cut opening 272-1 to form a seal layer 240-1. In some embodiments, the seal layer 240-1 is formed of a low-k dielectric material to reduce parasitic capacitance. The seal layer 240-1 may include the same dielectric material with the seal layer 240-2. Alternatively, the seal layer 240-1 may include different dielectric material from the seal layer 240-2 due to various needs of device performance. The dielectric material for the seal layer 240-1 may be deposited using plasma-enhanced CVD (PECVD), high-density-plasma CVD (HDPCVD), or CVD. In some instances, the dielectric material for the seal layer 240-1 may include silicon nitride, silicon carbonitride, silicon oxycarbonitride, silicon oxycarbide, or silicon oxynitride. In an embodiment, the low-k dielectric material is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains an air gap 242 in the relatively wider portions of the first gate cut opening 272-1 in the channel region, without entirely filling it. In the present embodiment, the PE-CVD process employs a setting with pressure less than about 0.75 torr and temperature higher than about 75° C. (but less than about 450° C. to avoid damaging metal features on the frontside of the workpiece 200). Hence, the low-k dielectric material may enclose the first gate cut opening 272-1 without a significant amount being deposited in the space and keep the air gaps 242 laterally between two adjacent gate structures 250. As a comparison, the first gate cut opening 272-1 in the S/D region may be substantially fully filled due to the relatively narrower space. That is, the air gap 242 may be limited in the channel region and do not extend continuously from a channel region to abutting S/D regions. A gas, such as a gas(es) used during the deposition of the dielectric material of the seal layer 240-1 or any other species that can diffuse into the air gap 242, may be in the air gap 242. Operations at block 120 may include performing a planarization process, such as a CMP process, to the seal layer 240-1 to remove excessive dielectric materials from the backside of the workpiece 200 and expose the backside dielectric layer 270. The air-gap-containing seal layer 240-1 vertically extending from the bottom surface of the dielectric cap layer 284 to the bottom surface of the backside dielectric layer 270, defining a gate isolation feature 244-1 disposed laterally between the adjacent gate structures 250 in the channel region and between the adjacent S/D features 230 in the S/D region, providing isolation. The air gap 242 in the gate isolation feature 244-1 may have roughly the same dimensions (e.g., height and width) as the air gap 242 in the gate isolation feature 244-2. In some embodiments, the middle portion of the gate isolation feature 244-1 or 244-2 has a width ranging from about 6 nm to about 42 nm. The air gap 242 may has a width ranging from about 0.5 nm to about 5 nm. A lateral distance between opposing sidewalls of the channel members 208 and the gate isolation feature 244-1 or 244-2 ranges from about 4 nm to about 15 nm. To be noticed, at the conclusion of block 124, the gate structure 250 of the MBC transistors T-1 is isolated from the gate structures 250 of the MBC transistors T-2 and T-3 due to the dividing of the metal cap layers 280 and 282 by the gate isolation feature 244-1.

Figures 14A, 14B:
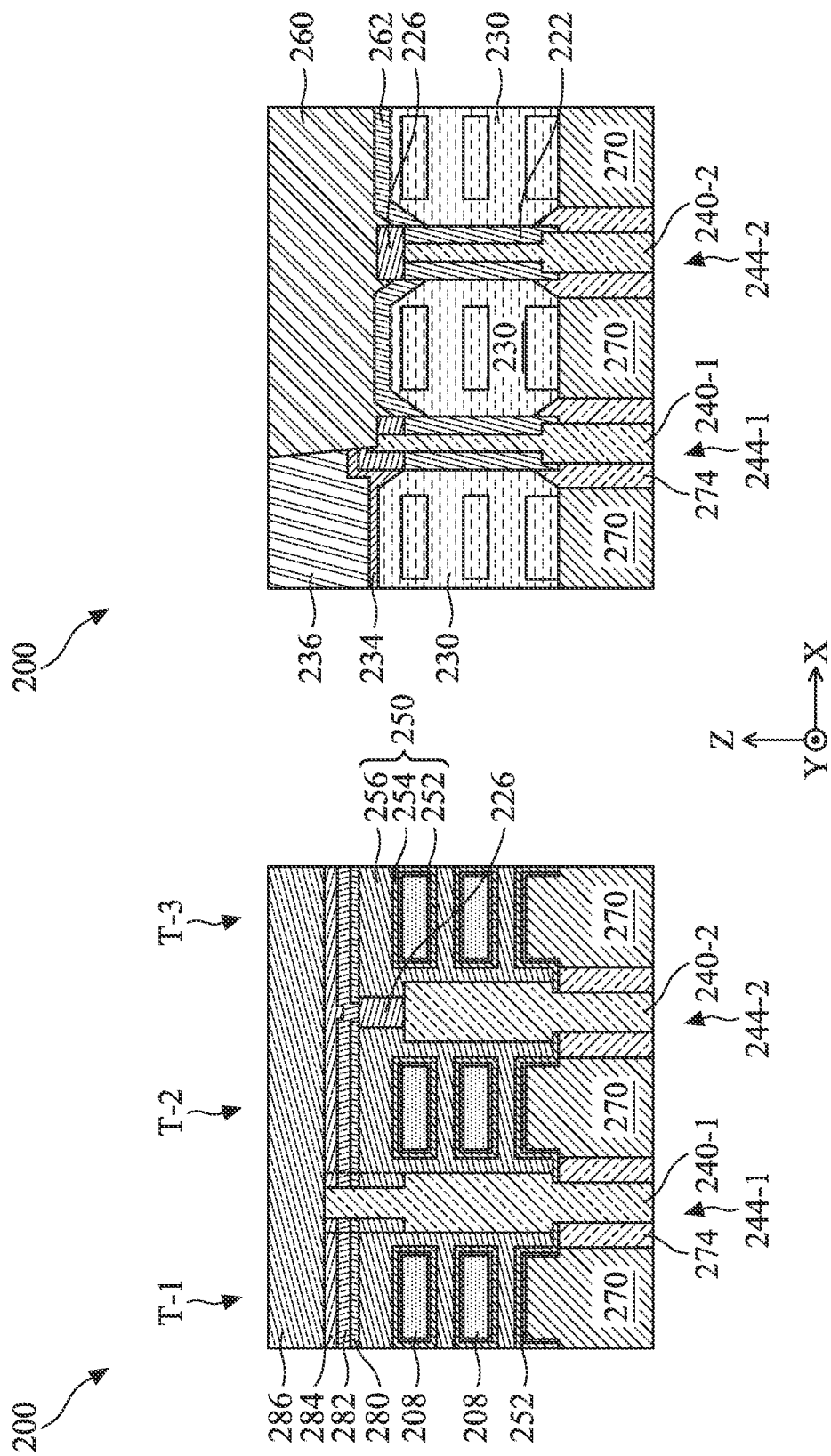

Reference is made to FIGS. 13A-13B. As a comparison with FIGS. 12A-12B, the air gap 242 in the gate isolation feature 244-1 may extend above into positions laterally between the metal cap layers 280 and 282, such that the top portion of the air gap 242 in the gate isolation feature 244-1 is higher than the air gap 242 in the gate isolation feature 244-2. The bottom portion of the air gap 242 in the gate isolation feature 244-1 may also be lower than the air gap 242 in the gate isolation feature 244-2. This may be due to the larger height of the first gate cut opening 272-1. In yet another embodiment, operations at blocks 120 and 124 may fully fill the gate cut openings 272-1 and 272-2, respectively, such that there are no air gaps formed in the gate isolation features 244-1 and 244-2, as illustrated in FIGS. 14A-14B.

Figures 15A, 15B:
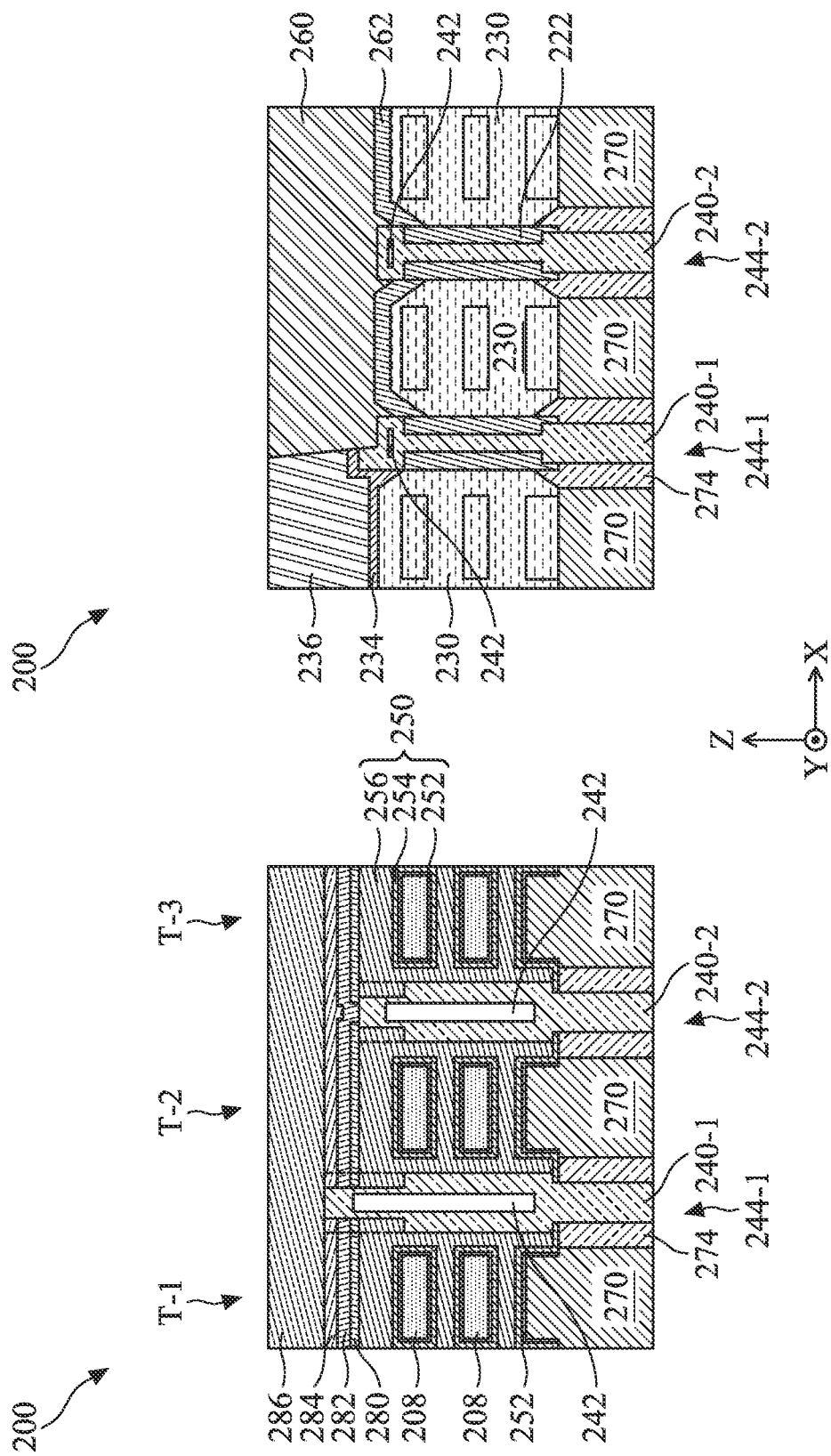
Figures 17A, 17B:
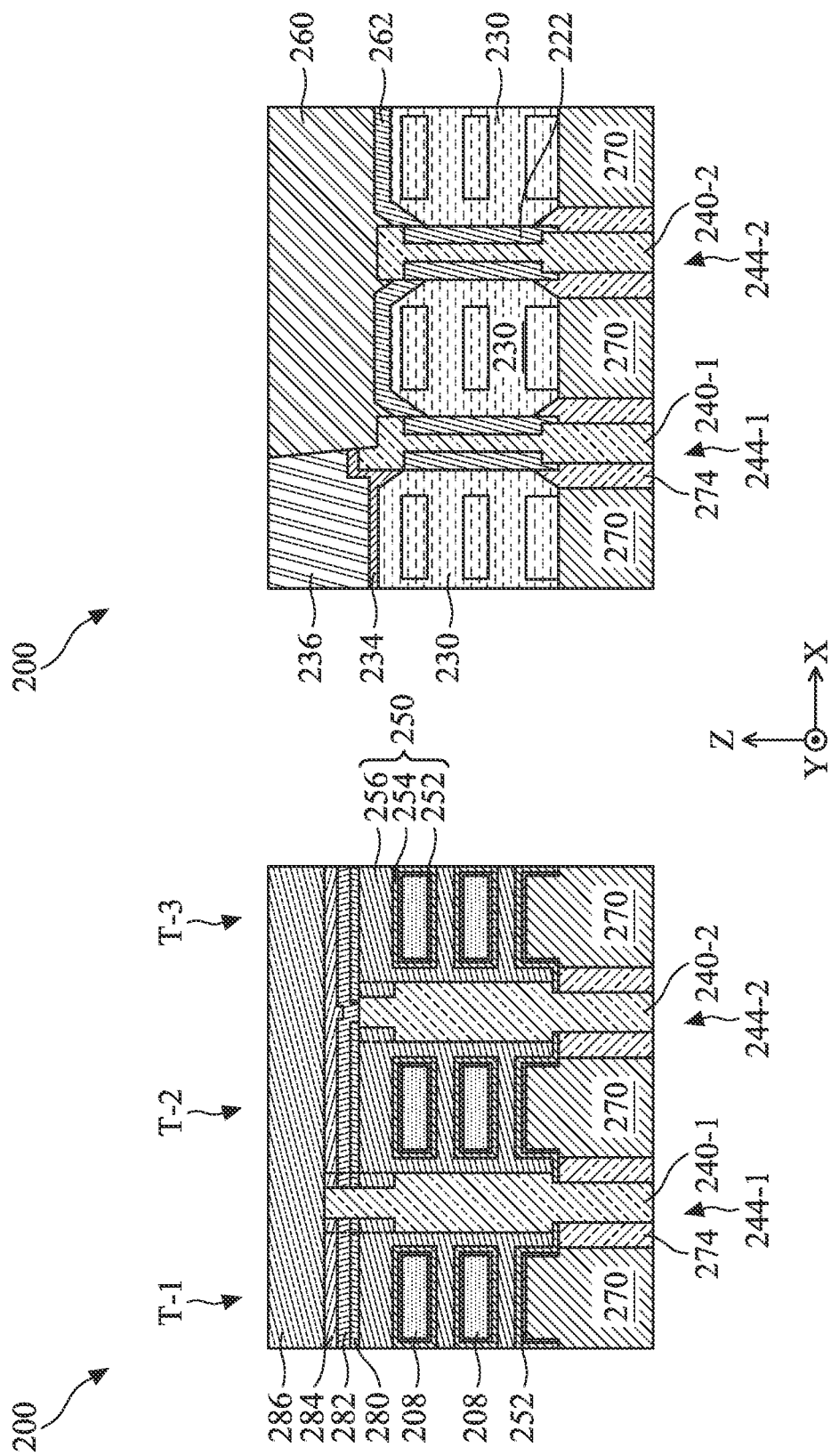

Reference is made to FIGS. 15A-15B, which depict an alternative embodiment. Compared with FIGS. 13A-13B, one difference is that the third dielectric layer 226 is fully removed in the S/D region and the seal layers 244-1 and 244-2 both interface the bottom surface of the S/D contact 260. The third dielectric layer 226 may be removed in a selective etching process during operations of block 114 such that the third dielectric layer 226 and second dielectric layer 224 of the hybrid fins 218 are removed together. After the removing of the third dielectric layer 226, in the S/D region, the top portion of each of the fill layers 240-1 and 240-2 has a larger width than the middle portion. The wider top portion may also trap air gaps 242 in the S/D region, as depicted in FIG. 14B. That is, the air gaps 242 may extend continuously from the channel region to the S/D region but with heights shrunk. In the channel region, the top portion of each of the fill layers 240-1 and 240-2 has a smaller width than the middle portion. Alternatively, sidewalls of the top portion and the middle portion may be flush, as illustrated by the dotted lines in FIG. 14A, such as due to the gate trimming process at block 116. In the channel region, the air gap 242 formed in the gate isolation feature 244-1 may has a top portion higher and a bottom portion lower than those of the air gap 242 formed in the gate isolation feature 244-2. This may be due to the larger height of the first gate cut opening 272-1. In another embodiment, in the S/D region, due to the less height of the top portion of the seal layer 240-2, the seal layer 240-2 may fully fill the gate cut opening 272-2 without trapping an air gap, such that only seal layer 240-1 traps air gap 242 in the S/D region, as illustrated in FIGS. 16A-16B. In yet another embodiment, operations at blocks 120 and 124 may fully fill the gate cut openings 272-1 and 272-2, such that there are no air gaps formed in the gate isolation features 244-1 and 244-2, as illustrated in FIGS. 17A-17B.

Figures 18A, 18B:
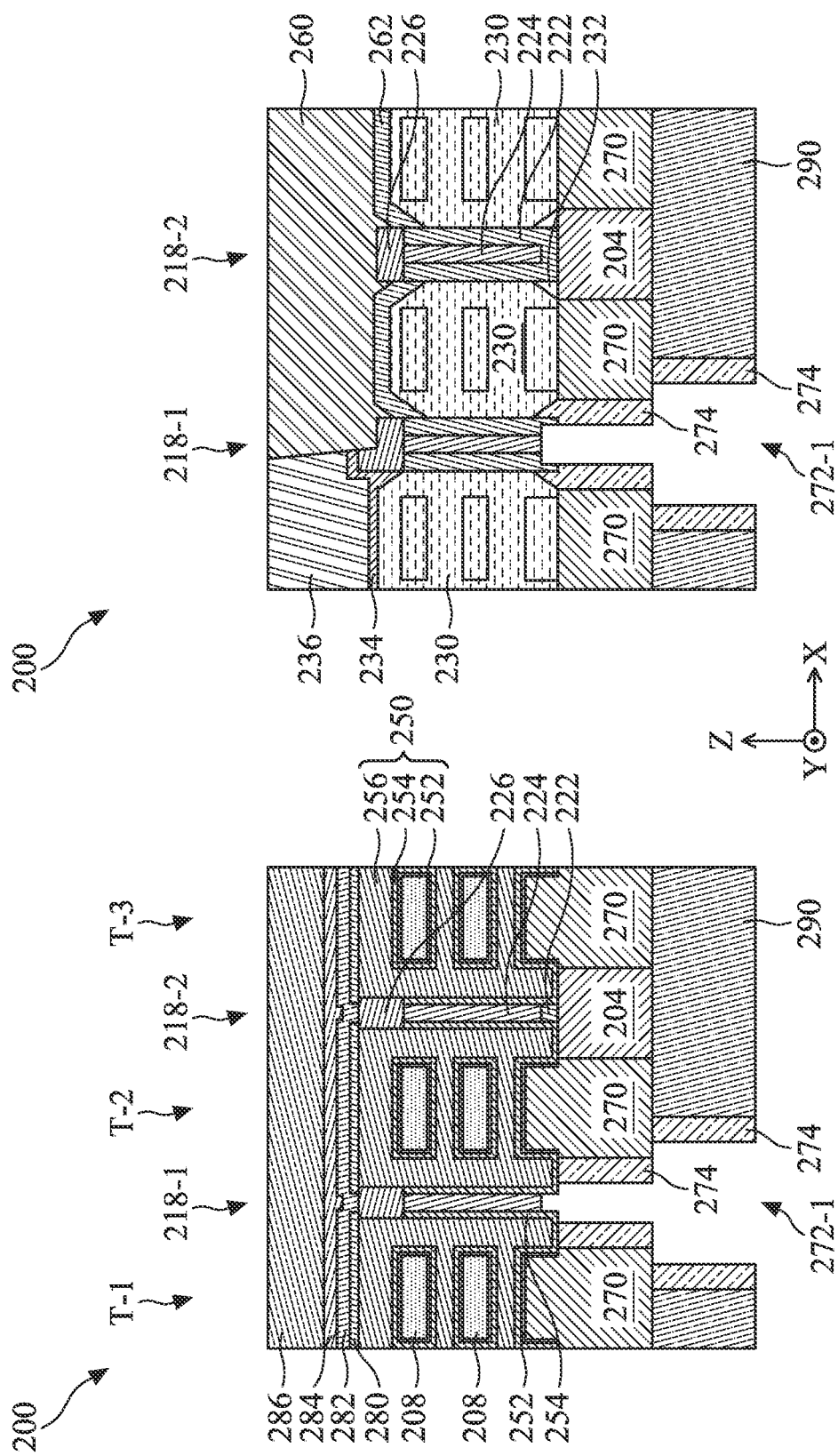

Reference is made to FIGS. 1C and 18A-18B. In an alternative embodiment of method 100, after operations at block 108, method 100 proceeds to a block 110' where only isolation feature 204 under the first hybrid fin 218-1 is removed to form a gate cut opening 272-1. Operations at block 110' first forms a patterned hard mask 290 over the backside of the workpiece 200 with a mask opening exposing the isolation feature 204 under the first hybrid fin 218-1. According to the present disclosure, the patterned hard mask 290 functions to mask portions of the isolation feature 204 under the second hybrid fin 218-2 that is not to be etched. The patterned hard mask 290 may include a nitride or a metal oxide and is patterned by photolithography and etching processes. Operations at block 110' then selectively etch the isolation feature 204 though the mask opening of the patterned hard mask 290 to form a gate cut opening 272-1. The isolation feature 204 may be etched using a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. As shown in FIGS. 18A and 18B, operations at block 110' also remove portions of the first dielectric layer 212 of the first hybrid fin 218-1 that is directly under the second dielectric layer 224. That is, the gate cut opening 272-1 may terminate on bottom surfaces of the second dielectric layer 224 of the first hybrid fin 218-1. Operations at block 110' may apply more than one etching processes. For example, it may apply a first etching process to selectively remove the isolation feature 204, and then apply a second etching process to selectively remove portions of the first dielectric layer 212 of the hybrid fins 218. As depicted in FIG. 18A, portions of the gate dielectric layer 254 is also exposed in the gate cut opening 272-1.

Still referring to FIGS. 1C and 18A-18B, after operations at block 110', method 100 proceeds to a block 112' where a liner 274 is deposited along sidewalls of the gate cut opening 272-1 and reduces the size of the gate cut opening 272-1. In the depicted embodiment, the liner 274 covers the exposed facets of the S/D features 230 and fills the voids 232. The liner 274 functions to protect the S/D features 230 from subsequent etching processes. By filling the voids 232, a top portion of the liner 274 may be higher than a bottom portion of the first dielectric layer 222. The liner 274 may be a single layer or a multi-layer. In some instances, the at least one dielectric material for the liner 274 may include silicon, oxygen, nitrogen, or carbon. For example, the at least one dielectric material may include silicon nitride, silicon carbonitride, silicon oxycarbonitride, silicon oxycarbide, or silicon oxynitride. The liner 274 may have a thickness between about 2 nm and about 10 nm. If the thickness of the liner 274 is less than about 2 nm, it may not effectively cover the S/D features 230. If the thickness of the liner 274 is larger than about 10 nm, the size of the gate cut openings 272 may shrink too much, which increases difficulties in removing the hybrid fin from the gate cut opening 272-1 in subsequent processes.

Figures 19A, 19B:
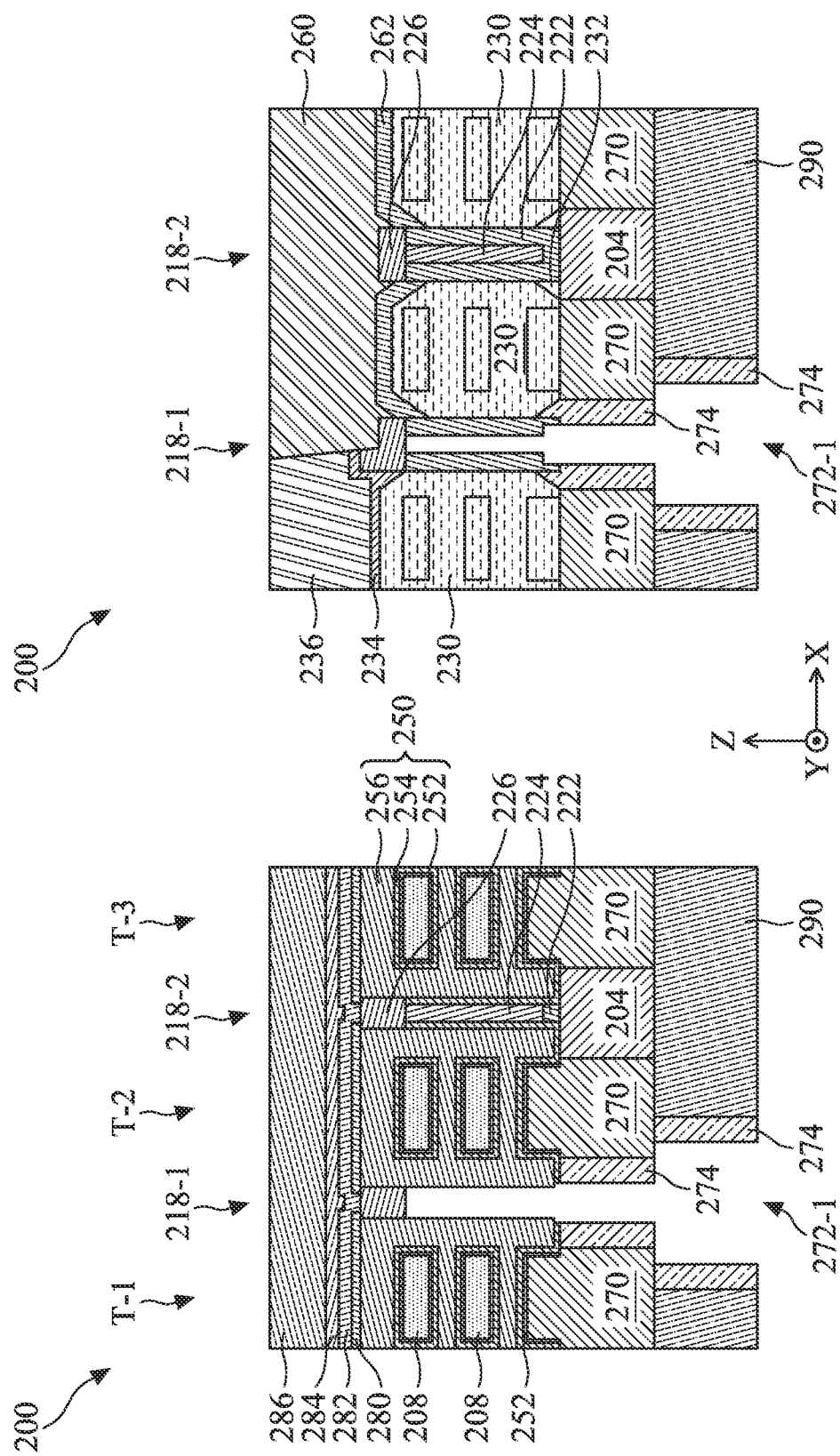

Referring to FIGS. 1C and 19A-19B, after operations at block 112', method 100 proceeds to a block 114' where the gate cut opening 272-1 is extended towards the frontside of the workpiece 200 by removing the second dielectric layer 224 from the first hybrid fin 218-1. In some embodiments, operations at block 114' apply an etching process that is tuned to be selective to the materials of the second dielectric layer 224 and with no (or minimal) etching to the gate dielectric layer 254, the first dielectric layer 222, the third dielectric layer 226, and the liner 274. That is, the gate cut opening 272-1 may terminate on bottom surfaces of the third dielectric layer 226 of the first hybrid fin 218-1. The etching process can be dry etching, wet etching, reactive ion etching, or other etching methods. In the depicted embodiment, operations at block 114' may also include an subsequent etching process that removes portions of the gate dielectric layer 254 exposed in the gate cut opening 272-1.

Figures 20A, 20B:
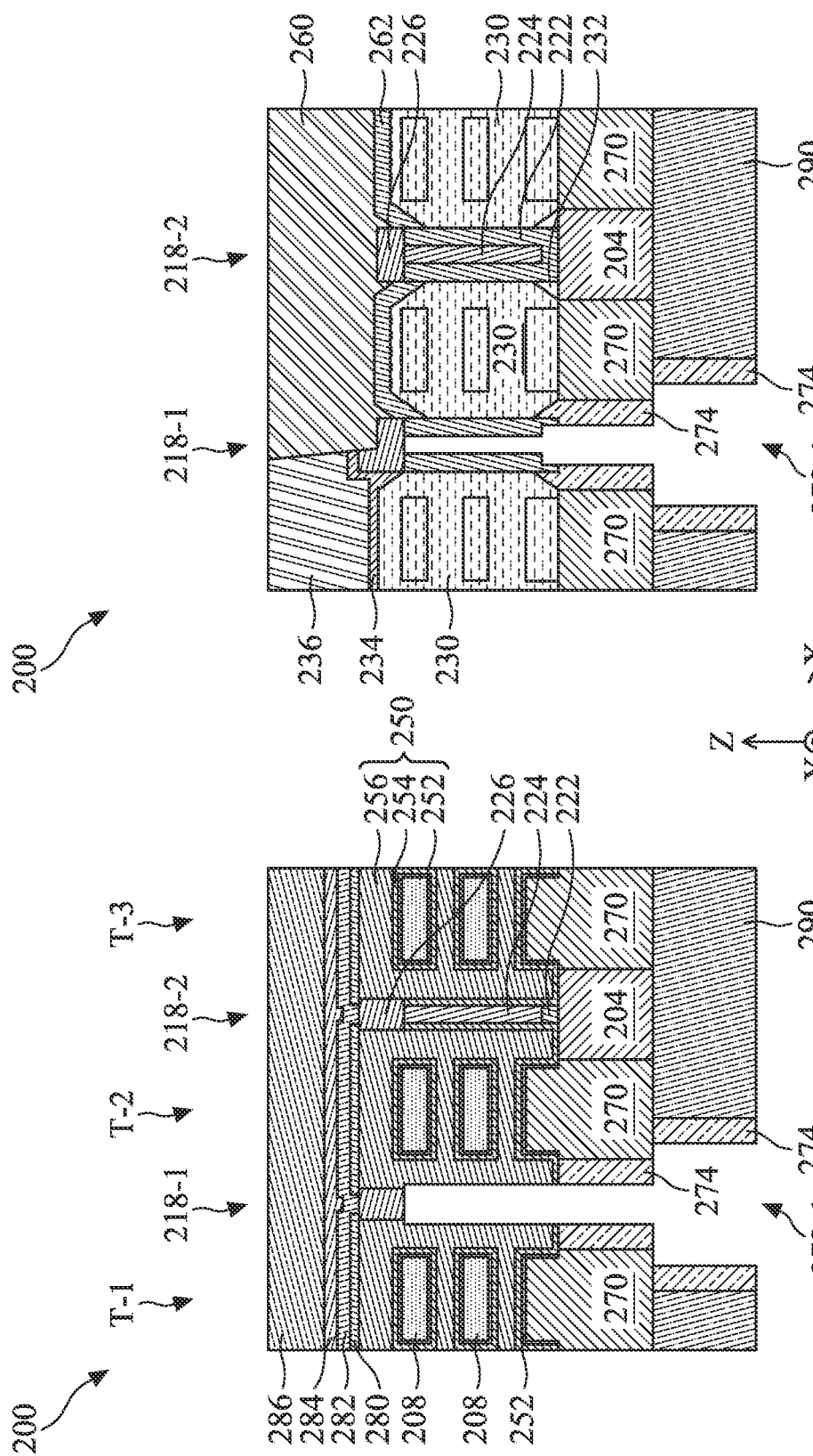

Referring to FIGS. 1C and 20A-20B, after operations at block 114', method 100 proceeds to a block 116' where the gate structures 250 are trimmed to laterally enlarge the gate cut opening 272-1 between adjacent gate structures 250. In some embodiments, operations at block 116' apply an etching process that is tuned to be selective to the materials of the gate electrode layer 256, which enlarges lateral distance between gate structures 250. The etching process can be dry etching, wet etching, reactive ion etching, or other etching methods.

Figures 21A, 21B:
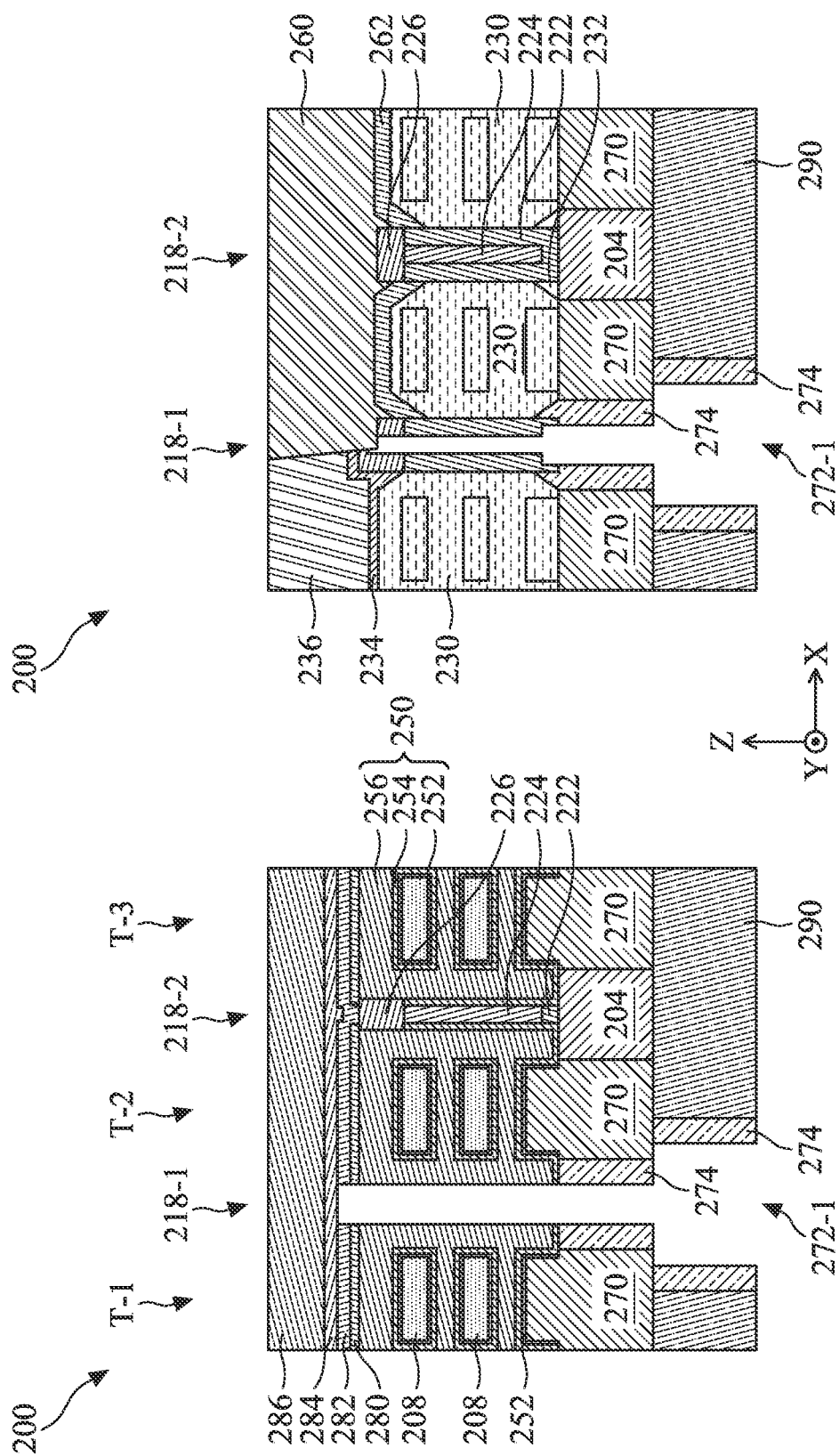

Referring to FIGS. 1C and 21A-21B, after operations at block 116', method 100 proceeds to a block 122' where an etching process is performed to further extend the gate cut opening 272-1 towards the frontside of the workpiece 200. In an example process, the etching process includes an isotropic or anisotropic etch process that is tuned to be selective to the materials of the third dielectric layer 262. The etching process further includes an anisotropic etching process that is tuned to be selective to the conductive materials of the metal cap layers 280 and 282. In some implementations, the anisotropic etch process may be a dry etch process (e.g., a reactive-ion etching (RIE)) that uses chlorine ($Cl_2$), oxygen ($O_2$), boron trifluoride ($BCl_3$), carbon tetrafluoride ($CF_4$), or a combination thereof. The dielectric cap layer 284 functions as an etch stop layer. In the depicted embodiment, the gate cut opening 272-1 terminates on or in the dielectric cap layer 284 in the channel region (FIG. 20A). In the S/D region, the first gate cut opening 272-1 exposes a bottom surface of the S/D contact 260 (FIG. 20B). In an embodiment, at conclusion of operations at the block 122', sidewalls of the extended top portion and middle portion of the gate cut opening 272-1 may be substantially flush in both the channel region and the S/D region.

Figures 22A, 22B:
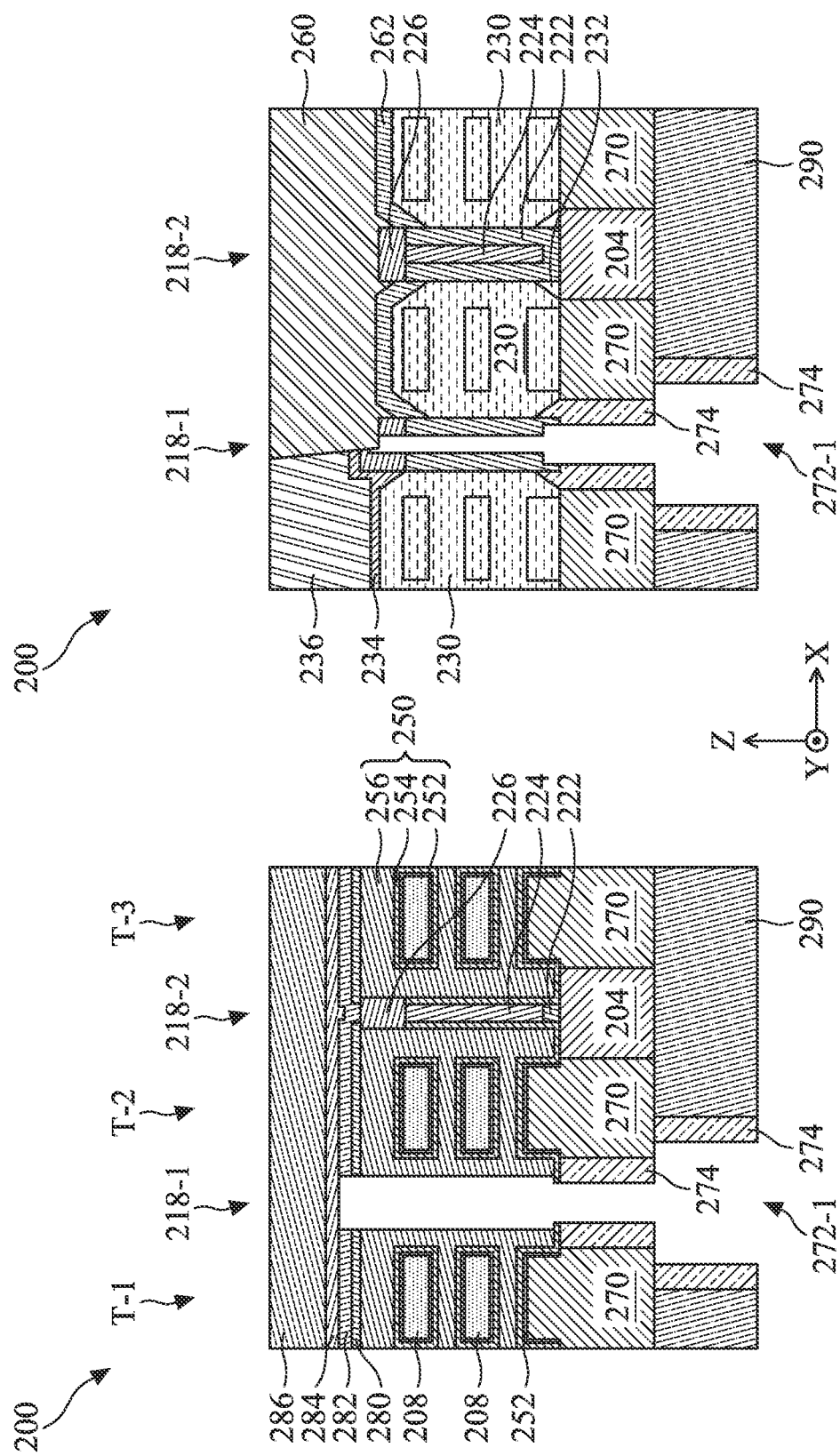

Referring to FIGS. 1C and 22A-22B, after operations at block 122', method 100 proceeds to a block 123' where the gate structures 250 are trimmed again to further laterally enlarge the gate cut opening 272-1 between adjacent gate structures 250. In some embodiments, operations at block 123' may be used as a cleaning process to remove oxide formed over exposed surfaces of the gate electrode 256. The etching process(es) can be dry etching, wet etching, reactive ion etching, or other etching methods. In an alternative embodiment, the gate trimming processes at block 116' may be skipped, and the gate structures 250 are trimmed once at block 123'.

Figures 23A, 23B:
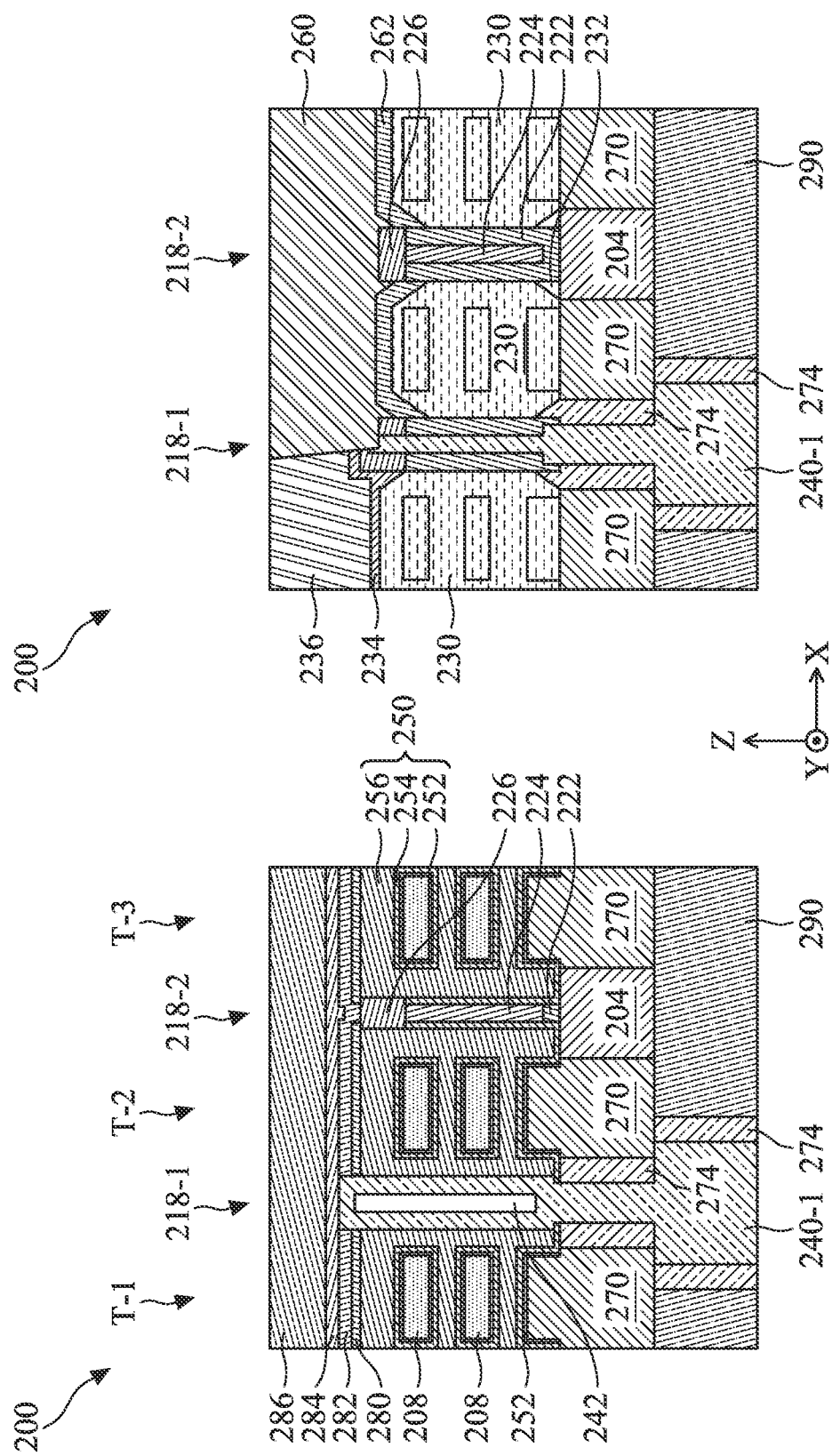
Figures 24A, 24B:
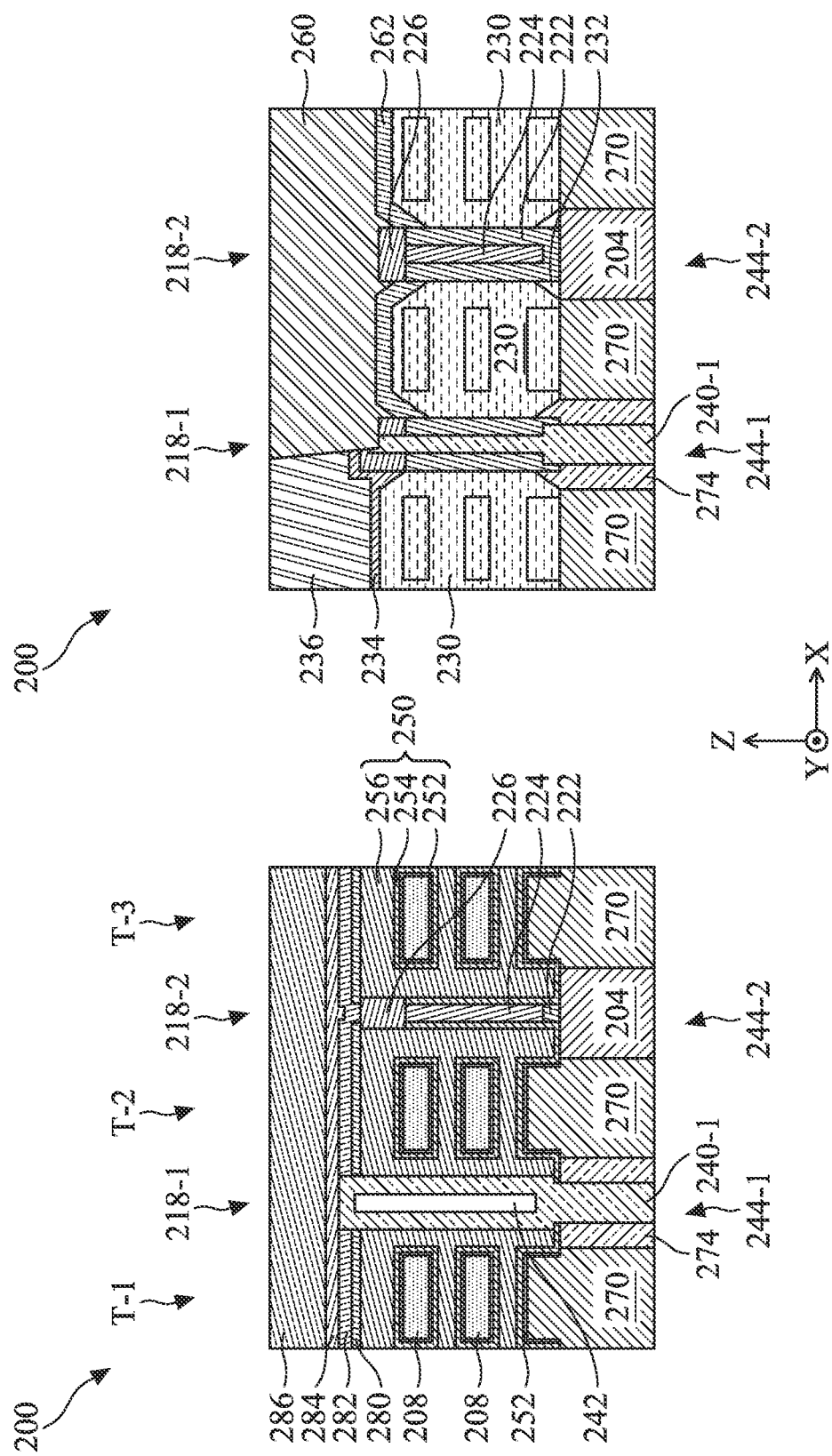

Referring to FIGS. 1C and 23A-23B, after operations at block 123', method 100 proceeds to a block 124' where a dielectric material is deposited in the gate cut opening 272-1 to form a seal layer 240-1. In some embodiments, the seal layer 240-1 is formed of a low-k dielectric material to reduce parasitic capacitance. The dielectric material for the seal layer 240-1 may be deposited using plasma-enhanced CVD (PECVD), high-density-plasma CVD (HDPCVD), or CVD. In some instances, the dielectric material for the seal layer 240-1 may include silicon nitride, silicon carbonitride, silicon oxycarbonitride, silicon oxycarbide, or silicon oxynitride. In an embodiment, the low-k dielectric material is deposited by a PE-CVD process, which is easier to have depositing dielectric materials merge on top of a narrow opening. The parameters in the PE-CVD process (e.g., pressure, temperature, and gas viscosity) are tuned in a way such that the gap fill behavior of depositing dielectric materials maintains an air gap 242 in the relatively wider portions of the gate cut opening 272-1 in the channel region, without entirely filling it. In the present embodiment, the PE-CVD process employs a setting with pressure less than about 0.75 torr and temperature higher than about 75° C. (but less than about 450° C. to avoid damaging metal features on the frontside of the workpiece 200). Hence, the low-k dielectric material may enclose the gate cut opening 272-1 without a significant amount being deposited in the space and keep the air gap 242 laterally between two adjacent gate structures 250. As a comparison, the gate cut opening 272-1 in the S/D region may be substantially fully filled due to the relatively narrower space. That is, the air gap 242 may be limited in the channel region and do not extend continuously from a channel region to abutting S/D regions. A gas, such as a gas(es) used during the deposition of the dielectric material of the seal layer 240-1 or any other species that can diffuse into the air gap 242, may be in the air gap 242.

Referring to FIGS. 1C and 23A-23B, after operations at block 124', method 100 proceeds to a block 126' where excessive dielectric materials from the backside of the workpiece 200 are removed to expose the backside dielectric layer 270. Operations at block 126' may include performing a planarization process, such as a CMP process, to the bottom surface of the workpiece 200. The backside dielectric layer 270 may function as a CMP stop layer. At the conclusion of operations at block 126', the air-gap-containing seal layer 240-1 vertically extending from the bottom surface of the dielectric cap layer 284 to the bottom surface of the backside dielectric layer 270, defining a first gate isolation feature 244-1 disposed laterally between the adjacent gate structures 250 in the channel region and the adjacent S/D features 230 in the S/D region, providing isolation. Similarly, the second hybrid fin 218-2 and the isolation feature 204 collectively define a second gate isolation feature 244-2. In an instance, a lateral distance between opposing sidewalls of the channel members 208 and the first gate isolation feature 244-1 is between 4 nm to about 15 nm, which is about 1 nm to about 3 nm shorter the lateral distance between opposing sidewalls of the channel members 208 and the second gate isolation feature 244-2 (or the second hybrid fin 218-2) due to the gate trimming process(es) at operations of blocks 116' and 123'.

To be noticed, at the conclusion of block 126', the gate structure 250 of the MBC transistors T-1 is isolated from the gate structures 250 of the MBC transistors T-2 and T-3 due to the dividing of the metal cap layers 280 and 282 by the first gate isolation feature 244-1, while the gate structures 250 of the MBC transistors T-2 and T-3 are still electrically connected through the metal cap layers 280 and 282 from the frontside of the workpiece 200.

After either block 124 or bock 126', the method 100 performs further fabrication processes to the workpiece 200. For example, it may remove the carrier substrate, form more interconnect layers on the frontside or backside of the workpiece 200, form passivation layers, and perform other BEOL processes.

Embodiments of the present disclosure provide advantages. For example, methods of the present disclosure form gate isolation features from a backside of a workpiece. Using structures on the backside of the workpiece, the formation of the gate cut openings of the present disclosure is self-aligned and does not rely on high resolution or high overlay precision of the photolithography process. Further, in some embodiments of the present disclosure, by implementing air-gap-containing gate isolation features between adjacent gate structures, the overall effective dielectric constant is reduced, which in turn leads to less parasitic capacitance and better isolation.

In one exemplary aspect, the present disclosure is directed to a method. The method includes providing a workpiece including a frontside and a backside. The workpiece includes a substrate, a first plurality of channel members over a first portion of the substrate, a second plurality of channel members over a second portion of the substrate, a first gate structure engaging the first plurality of channel members, a second gate structure engaging the second plurality of channel members, a hybrid fin disposed between the first and second gate structures, an isolation feature disposed under the hybrid fin and sandwiched between the first and second portions of the substrate, wherein the substrate is at the backside of the workpiece and the first and second pluralities of channel members are at the frontside of the workpiece. The method also includes forming a metal cap layer at the frontside of the workpiece, the metal cap layer electrically connecting the first and second gate structures, etching the isolation feature, thereby forming an opening exposing the hybrid fin at the backside of the workpiece, etching the hybrid fin, thereby extending the opening to a bottom surface of the metal cap layer, etching the metal cap layer, thereby dividing the metal cap layer into two segments, and depositing a dielectric material into the opening, thereby forming a gate isolation feature disposed between the first and second gate structures. In some embodiments, the depositing of the dielectric material seals an air gap between the first and second gate structures. In some embodiments, a top portion of the air gap is laterally between the two segments of the divided metal cap layer. In some embodiments, the method also includes bonding the frontside of the workpiece to a carrier substrate, and prior to the forming of the opening, flipping the workpiece over. In some embodiments, the method also includes prior to the forming of the opening, removing the first and second portions of the substrate from the backside of the workpiece to form trenches, where the trenches expose the first and second gate structures at the backside of the workpiece, and depositing a backside dielectric layer in the trenches. In some embodiments, the trenches also expose source/drain features abutting the first and second pluralities of channel members. In some embodiments, the method also includes prior to the etching of the hybrid fin, depositing a dielectric liner over sidewalls of the opening. In some embodiments, the method also includes prior to the depositing of the dielectric material, trimming the first and second gate structures, thereby expanding a width of the opening. In some embodiments, the hybrid fin includes a lower portion and an upper portion, the upper portion having a larger dielectric constant than the lower portion, and the etching of the hybrid fin includes performing a first etching process to remove the lower portion of the hybrid fin, trimming the first and second gate structures to enlarge the opening, and after the trimming of the first and second gate structures, performing a second etching process to remove the upper portion of the hybrid fin.

In another exemplary aspect, the present disclosure is directed to a method of forming a semiconductor device. The method includes forming a plurality of channel members over a base portion that protrudes from a substrate, the channel members being vertically stacked, depositing an isolation feature over sidewalls of the base portion, forming first and second dielectric fins over the isolation feature and sandwiching the channel members, forming a source/drain feature over the base portion and abutting the channel members, forming a gate structure over the base portion and wrapping around each of the channel members, wherein the first and second dielectric fins interface sidewalls of the gate structure, etching the base portion, thereby forming a first trench exposing the source/drain feature and the gate structure from a backside of the semiconductor device, depositing a first dielectric layer in the first trench, forming a mask layer at the backside of the semiconductor device, the mask layer having a mask opening directly under the first dielectric fin, etching the isolation feature through the mask opening, thereby forming a second trench exposing the first dielectric fin from the backside of the semiconductor device, removing the first dielectric fin from the second trench, and depositing a second dielectric layer in the second trench. The method also includes prior to the removing of the first dielectric fin, depositing a dielectric liner on sidewalls of the second trench. In some embodiments, the depositing of the second dielectric layer seals an air gap in the second trench. In some embodiments, a top portion of the second dielectric layer is above the second dielectric fin. In some embodiments, the method also includes forming a source/drain contact above the source/drain feature and the first and second dielectric fins, where the removing of the first dielectric fin exposes a bottom surface of the source/drain contact. In some embodiments, the method also includes prior to the depositing of the second dielectric layer, performing a gate trimming process to enlarge a width of the second trench.

In yet another exemplary aspect, the present disclosure is directed to a semiconductor device. The semiconductor device includes a first plurality of channel members over a first backside dielectric feature, a second plurality of channel members over a second backside dielectric feature, a first source/drain feature abutting the first plurality of channel members and over the first backside dielectric feature, a second source/drain feature abutting the second plurality of channel members and over the second backside dielectric feature, a first gate structure wrapping around each of the first plurality of channel members, a second gate structure wrapping around each of the second plurality of channel members, and an isolation feature includes a first portion stacked between the first and second gate structures and a second portion stacked between the first and second source/drain features. A top surface of the first portion of the isolation feature is above the second portion of the isolation feature. In some embodiments, the isolation feature includes an air gap stacked between the first gate structure and the second gate structure. In some embodiments, a top portion of the air gap extends continuously into a position between the first and second source/drain features. In some embodiments, a top portion of the air gap is above the first and second gate structures. In some embodiments, a bottom portion of the isolation feature is stacked between the first and second backside dielectric features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a workpiece including a frontside and a backside, the workpiece including a substrate, a first plurality of channel members over a first portion of the substrate, a second plurality of channel members over a second portion of the substrate, a first gate structure engaging the first plurality of channel members, a second gate structure engaging the second plurality of channel members, a hybrid fin disposed between the first and second gate structures, an isolation feature disposed under the hybrid fin and sandwiched between the first and second portions of the substrate, wherein the substrate is at the backside of the workpiece and the first and second pluralities of channel members are at the frontside of the workpiece;
forming a metal cap layer at the frontside of the workpiece, the metal cap layer electrically connecting the first and second gate structures;
etching the isolation feature, thereby forming an opening exposing the hybrid fin at the backside of the workpiece;
etching the hybrid fin, thereby extending the opening to a bottom surface of the metal cap layer;
etching the metal cap layer, thereby dividing the metal cap layer into two segments; and
depositing a dielectric material into the opening, thereby forming a gate isolation feature disposed between the first and second gate structures.

2. The method of claim 1, wherein the depositing of the dielectric material seals an air gap between the first and second gate structures.

3. The method of claim 2, wherein a top portion of the air gap is laterally between the two segments of the divided metal cap layer.

4. The method of claim 1, further comprising:
bonding the frontside of the workpiece to a carrier substrate; and
prior to the forming of the opening, flipping the workpiece over.

5. The method of claim 1, further comprising:
prior to the forming of the opening, removing the first and second portions of the substrate from the backside of the workpiece to form trenches, wherein the trenches expose the first and second gate structures at the backside of the workpiece; and
depositing a backside dielectric layer in the trenches.

6. The method of claim 5, wherein the trenches also expose source/drain features abutting the first and second pluralities of channel members.

7. The method of claim 1, further comprising:
prior to the etching of the hybrid fin, depositing a dielectric liner over sidewalls of the opening.

8. The method of claim 1, further comprising:
prior to the depositing of the dielectric material, trimming the first and second gate structures, thereby expanding a width of the opening.

9. The method of claim 1, wherein the hybrid fin includes a lower portion and an upper portion, the upper portion having a larger dielectric constant than the lower portion, wherein the etching of the hybrid fin includes:
performing a first etching process to remove the lower portion of the hybrid fin,
trimming the first and second gate structures to enlarge the opening, and
after the trimming of the first and second gate structures, performing a second etching process to remove the upper portion of the hybrid fin.

10. A method of forming a semiconductor device, comprising:
forming a plurality of channel members over a base portion that protrudes from a substrate, the channel members being vertically stacked;
depositing an isolation feature over sidewalls of the base portion;
forming first and second dielectric fins over the isolation feature and sandwiching the channel members;
forming a source/drain feature over the base portion and abutting the channel members;
forming a gate structure over the base portion and wrapping around each of the channel members, wherein the first and second dielectric fins interface sidewalls of the gate structure;
etching the base portion, thereby forming a first trench exposing the source/drain feature and the gate structure from a backside of the semiconductor device;
depositing a first dielectric layer in the first trench;
forming a mask layer at the backside of the semiconductor device, the mask layer having a mask opening directly under the first dielectric fin;
etching the isolation feature through the mask opening, thereby forming a second trench exposing the first dielectric fin from the backside of the semiconductor device;
removing the first dielectric fin from the second trench; and
depositing a second dielectric layer in the second trench.

11. The method of claim 10, further comprising:
prior to the removing of the first dielectric fin, depositing a dielectric liner on sidewalls of the second trench.

12. The method of claim 10, wherein the depositing of the second dielectric layer seals an air gap in the second trench.

13. The method of claim 12, wherein a top portion of the second dielectric layer is above the second dielectric fin.

14. The method of claim 10, further comprising:
forming a source/drain contact above the source/drain feature and the first and second dielectric fins, wherein the removing of the first dielectric fin exposes a bottom surface of the source/drain contact.

15. The method of claim 10, further comprising:
prior to the depositing of the second dielectric layer, performing a gate trimming process to enlarge a width of the second trench.

16. A semiconductor device, comprising:
a first plurality of channel members over a first backside dielectric feature;
a second plurality of channel members over a second backside dielectric feature;

a first source/drain feature abutting the first plurality of channel members and over the first backside dielectric feature;

a second source/drain feature abutting the second plurality of channel members and over the second backside dielectric feature;

a first gate structure wrapping around each of the first plurality of channel members;

a second gate structure wrapping around each of the second plurality of channel members; and an isolation feature includes a first portion stacked between the first and second gate structures and a second portion stacked between the first and second source/drain features, wherein a top surface of the first portion of the isolation feature is above the second portion of the isolation feature.

17. The semiconductor device of claim 16, wherein the isolation feature includes an air gap stacked between the first gate structure and the second gate structure.

18. The semiconductor device of claim 17, wherein a top portion of the air gap extends continuously into a position between the first and second source/drain features.

19. The semiconductor device of claim 17, wherein a top portion of the air gap is above the first and second gate structures.

20. The semiconductor device of claim 16, wherein a bottom portion of the isolation feature is stacked between the first and second backside dielectric features.

\* \* \* \* \*